US010520163B2

(12) United States Patent
Shinohara et al.

(10) Patent No.: US 10,520,163 B2
(45) Date of Patent: Dec. 31, 2019

(54) LIGHT BUNDLE CONTROL MEMBER, LIGHT EMITTING DEVICE, AND ILLUMINATING DEVICE

(71) Applicant: Enplas Corporation, Saitama (JP)

(72) Inventors: Hiroyuki Shinohara, Saitama (JP); Akinobu Seki, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 16/339,393

(22) PCT Filed: Sep. 27, 2017

(86) PCT No.: PCT/JP2017/034825
§ 371 (c)(1),
(2) Date: Apr. 4, 2019

(87) PCT Pub. No.: WO2018/066418
PCT Pub. Date: Apr. 12, 2018

(65) Prior Publication Data
US 2019/0285245 A1    Sep. 19, 2019

(30) Foreign Application Priority Data

Oct. 4, 2016  (JP) ................................ 2016-196620
Sep. 22, 2017 (JP) ................................ 2017-182710

(51) Int. Cl.
*F21V 7/00*      (2006.01)
*F21V 7/04*      (2006.01)
(Continued)

(52) U.S. Cl.
CPC ............ *F21V 7/0025* (2013.01); *F21V 7/045* (2013.01); *F21V 7/08* (2013.01); *F21V 7/24* (2018.02); *G02B 5/0205* (2013.01)

(58) Field of Classification Search
CPC .......... F21V 7/0025; F21V 7/045; F21V 7/08; F21V 7/24; G02B 5/0205
See application file for complete search history.

(56) References Cited

U.S. PATENT DOCUMENTS 6,674,096 B2   1/2004   Sommers
7,543,965 B2   6/2009   Noh
(Continued)

FOREIGN PATENT DOCUMENTS

CN        1993582 A      7/2007
CN      105042507 A     11/2015
(Continued)

OTHER PUBLICATIONS

International Search Report from International Application No. PCT/JP2017/034825 dated Nov. 14, 2017.

*Primary Examiner* — Thomas M Sember
(74) *Attorney, Agent, or Firm* — Brundidge & Stanger, P.C.

(57) ABSTRACT

A light bundle control member of the present invention comprises: an entry plane on which light emitted from a light emitting element becomes incident; two reflecting planes which are arranged across the entry plane in positions opposing the light emitting element, and which respectively reflect some of the light entering via the entry plane in two directions that are substantially perpendicular to the optical axis of the light emitting element and opposed to each other; and two output planes which are arranged opposing each other across the two reflecting planes, and which respectively cause the light reflected by the two reflecting planes to be externally output. Each of the two output planes has a plurality of first ridges arranged thereon, wherein, as viewed from the output plane side, a ridge line of the plurality of first ridges is substantially parallel with the optical axis of the light emitting element.

8 Claims, 28 Drawing Sheets

(51) Int. Cl.
*G02B 5/02* (2006.01)
*F21V 7/24* (2018.01)
*F21V 7/08* (2006.01)

(56) References Cited

U.S. PATENT DOCUMENTS

| | | |
|---|---|---|
| 8,591,074 B1 | 11/2013 | Jiang |
| 2006/0067640 A1 | 3/2006 | Hsieh |
| 2008/0130316 A1 | 6/2008 | Kinoshita |
| 2015/0267877 A1 | 9/2015 | Hiraka |
| 2015/0345748 A1 | 12/2015 | Saito |

FOREIGN PATENT DOCUMENTS

| | | |
|---|---|---|
| CN | 105221939 A | 1/2016 |
| JP | 09-018058 A | 1/1997 |
| JP | 2004-281606 A | 10/2004 |
| JP | 2006-99117 A | 4/2006 |
| JP | 2014-67023 A | 4/2014 |
| JP | 2015-109257 A | 6/2015 |
| TW | 200943590 A1 | 10/2009 |

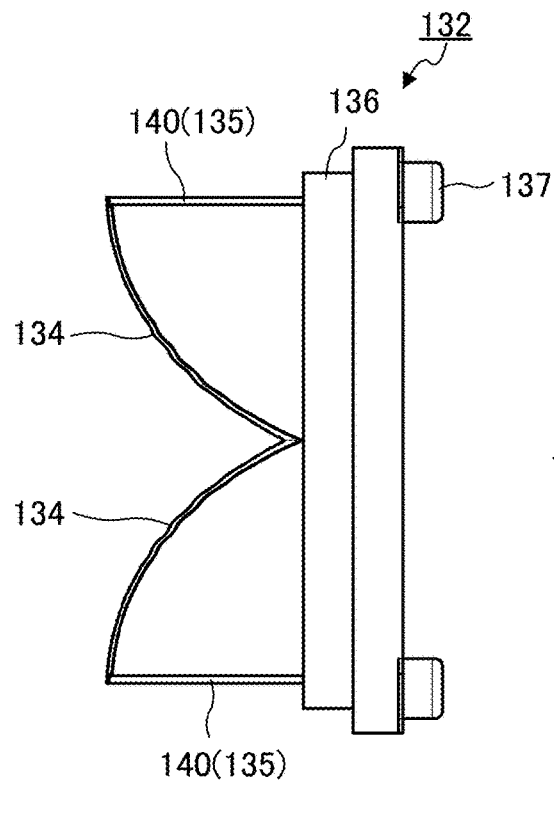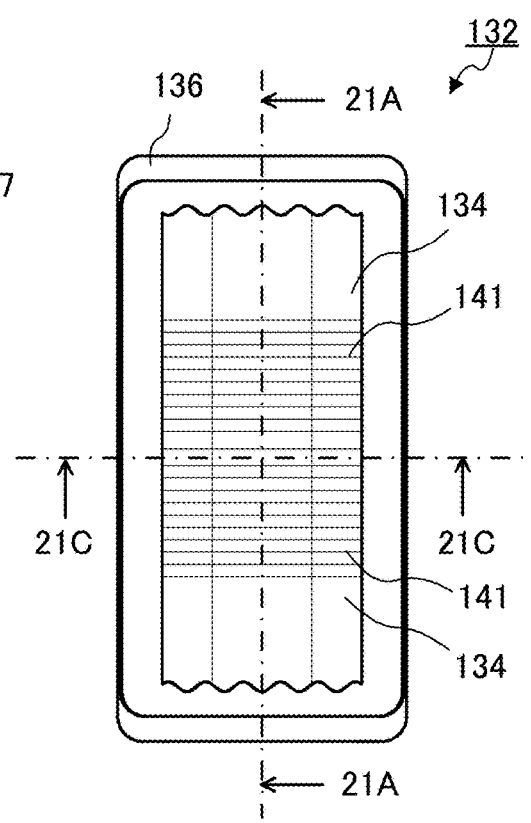
FIG. 20A  FIG. 20B
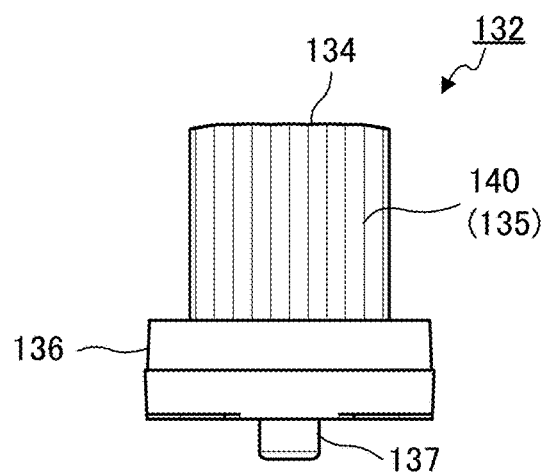
FIG. 20C

LIGHT BUNDLE CONTROL MEMBER, LIGHT EMITTING DEVICE, AND ILLUMINATING DEVICE

TECHNICAL FIELD

The present invention relates to a light flux controlling member, a light-emitting device and an illumination apparatus.

BACKGROUND ART

A light-emitting device including a light-emitting element such as an LED is used as a light source of an illumination apparatus and a sign. In particular, a light-emitting device in which light emitted from a light-emitting element is horizontally reflected in two opposite directions so as to provide an anisotropic light distribution character (an ellipse light distribution) is used as a light source of channel letter signs having a special shape.

As a light-emitting device having an anisotropic light distribution character, PTL 1 discloses a light-emitting device including light-emitting element 12, a base including reflection cup 14a configured to reflect light emitted from light-emitting element 12 upward, and light flux controlling member 13 (referred to as optically transparent resin in PTL 1) including reflection surface 17 configured to reflect light emitted from light-emitting element 12 and light reflected by reflection cup 14a as illustrated in FIG. 1, for example. In this light-emitting device, light emitted from the top surface of light-emitting element 12 reaches reflection surface 17 of light flux controlling member 13, and light emitted from a side surface of light-emitting element 12 reaches reflection surface 17 of light flux controlling member 13 after being reflected by reflection cup 14a. The light rays reaching reflection surface 17 of light flux controlling member 13 horizontally travel in opposite directions, so as to be emitted to the outside from emission surface 19 of light flux controlling member 13 (referred to as side surface in PTL 1).

Such a light-emitting device uses a light-emitting element such as an LED. The majority of inexpensively mass-produced LEDs is a light-emitting element (SMD light-emitting element) including a light emission part that emits blue light, and a phosphor that covers the light emission part and converts blue light emitted from the light emission part into white light, for example.

CITATION LIST

Patent Literature

PTL 1
Japanese Patent Application Laid-Open No. H9-18058

SUMMARY OF INVENTION

Technical Problem

In SMD light-emitting elements, blue light emitted at a large angle to the light axis of the light-emitting element tends to be converted into white light. Blue light emitted at a small angle to the light axis of the light-emitting element does not tend to be converted into white light, and consequently such light tends to be emitted as blue light. Even with light-emitting elements other than SMD light-emitting elements, when a light-emitting element whose color appearance differs depending on the emission direction is used in a light-emitting device, color unevenness frequently occurs in a region where light emitted at a small angle to the light axis of the light-emitting element arrives and a region where light emitted at a large angle to the light axis arrives.

Such color unevenness significantly occurs in a light-emitting device provided with an anisotropic light distribution character, such as that disclosed in PTL 1.

To suppress color unevenness in a light-emitting device such as that disclosed in PTL 1, it is conceivable to roughen emission surface 19 of light flux controlling member 13. However, when emission surface 19 of light flux controlling member 13 is roughened, light emitted from emission surface 19 of light flux controlling member 13 is scattered, thus making it difficult to appropriately control the light distribution.

In view of this, an object of the present invention is to provide a light flux controlling member capable of suppressing color unevenness resulting from a light-emitting element while maintaining desired light distribution characteristics. In addition, another object of the present invention is to provide a light-emitting device and an illumination apparatus including the light flux controlling member.

Solution to Problem

A light flux controlling member according to the present invention is configured to control a distribution of light emitted from a light-emitting element, the light flux controlling member including: an incidence surface configured to receive the light emitted from the light-emitting element; two reflection surfaces disposed opposite to the light-emitting element with the incidence surface interposed between the light-emitting element and the two reflection surfaces, the two reflection surfaces being configured to reflect a part of light that is entered from the incidence surface such that the part of light travels in two opposite directions substantially perpendicular to a light axis of the light-emitting element; and two emission surfaces disposed opposite to each other with the two reflection surfaces interposed between the two emission surfaces, the two emission surfaces being configured to emit, to outside, light reflected by the two reflection surfaces. a plurality of first ridges are disposed in each of the two emission surfaces, and ridgelines of the plurality of first ridges are substantially parallel with the light axis of the light-emitting element as viewed from an emission surface side.

A light-emitting device according to the present invention includes: a light-emitting element; and the light flux controlling member in which the incidence surface is disposed such that the incidence surface intersects the light axis of the light-emitting element.

An illumination apparatus according to the present invention includes: a plurality of the light-emitting devices; and a light diffusion plate configured to allow light emitted from the plurality of light-emitting devices to pass through the light diffusion plate while diffusing the light.

BRIEF DESCRIPTION OF DRAWINGS

FIGS. 20A to 20C illustrate a configuration of a light flux controlling member according to Embodiment 3;

DESCRIPTION OF EMBODIMENTS

Embodiments of the present invention are elaborated below with reference to the accompanying drawings.

Embodiment 1

Configuration of Illumination Apparatus

Figure 1:
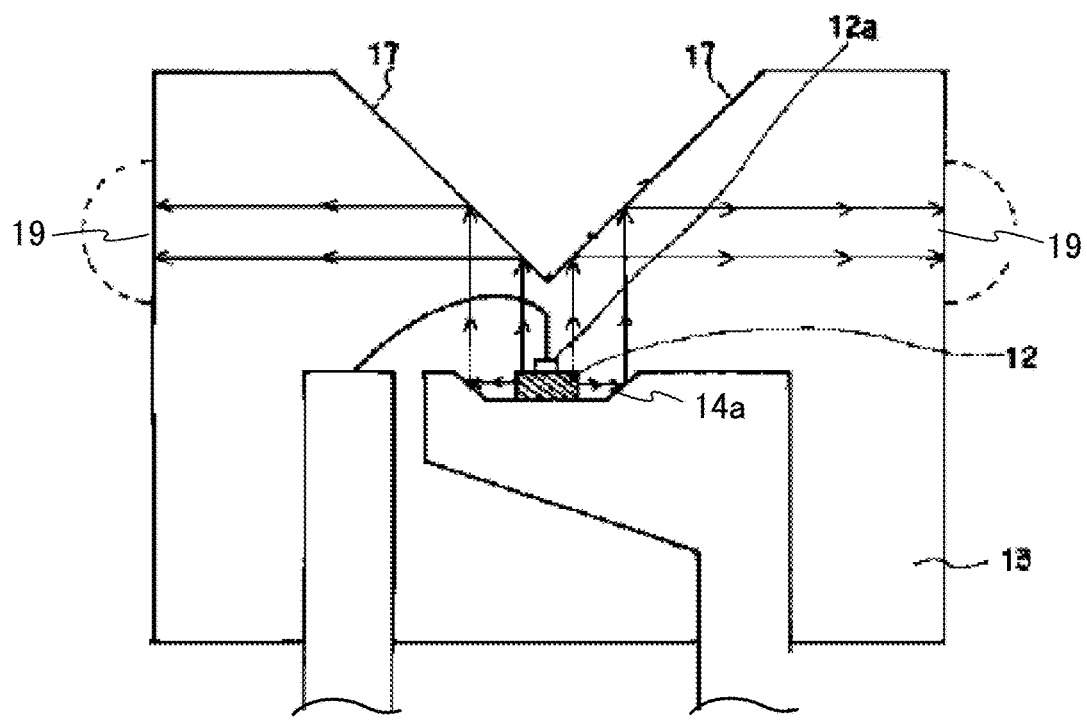
FIG. 1 illustrates a configuration of a conventional light-emitting device.
Figure 2A:
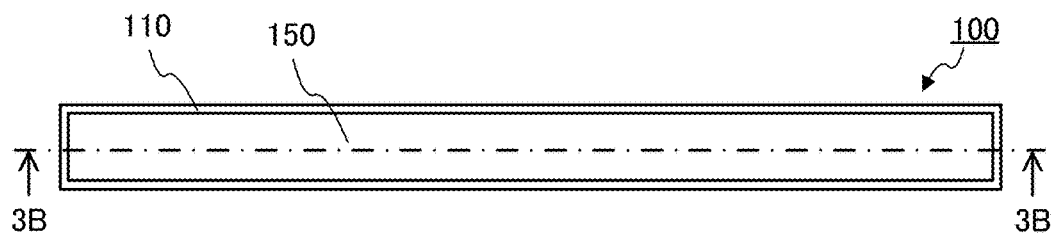
FIGS. 2A and 2B illustrate a configuration of an illumination apparatus according to Embodiment 1.
Figure 2B:
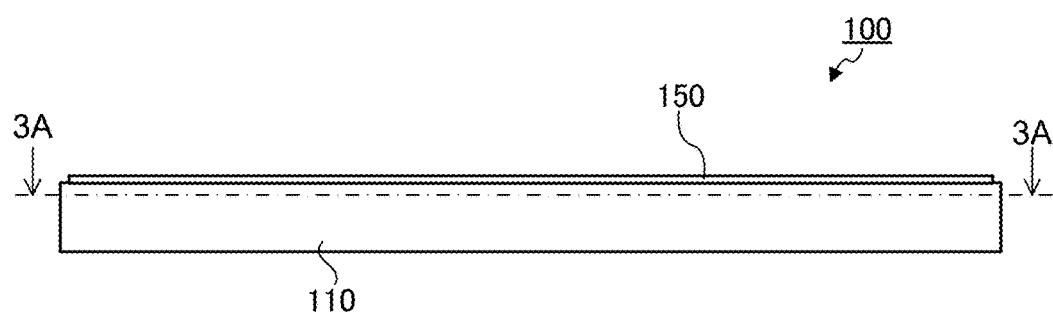
Figure 3A:
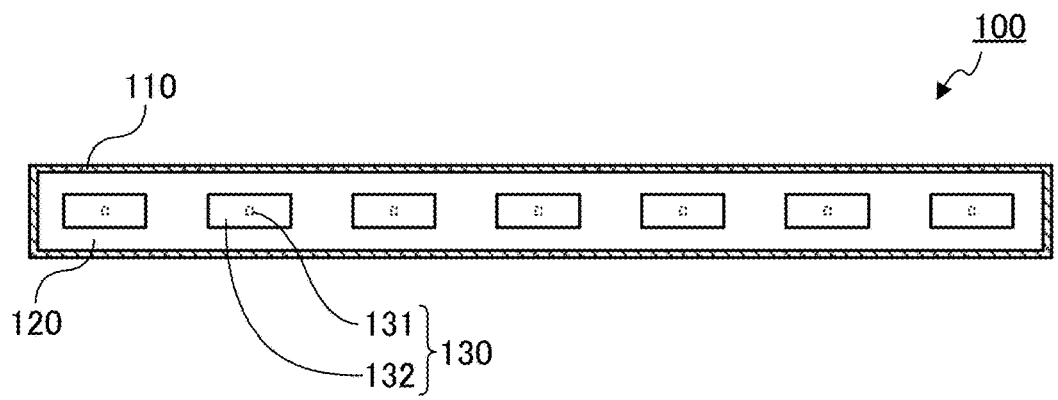
FIGS. 3A and 3B are sectional views of the illumination apparatus.
Figure 3B:
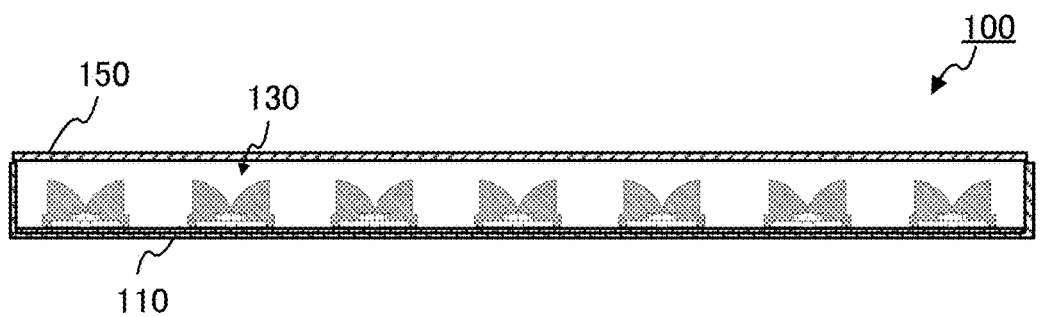
Figure 4:
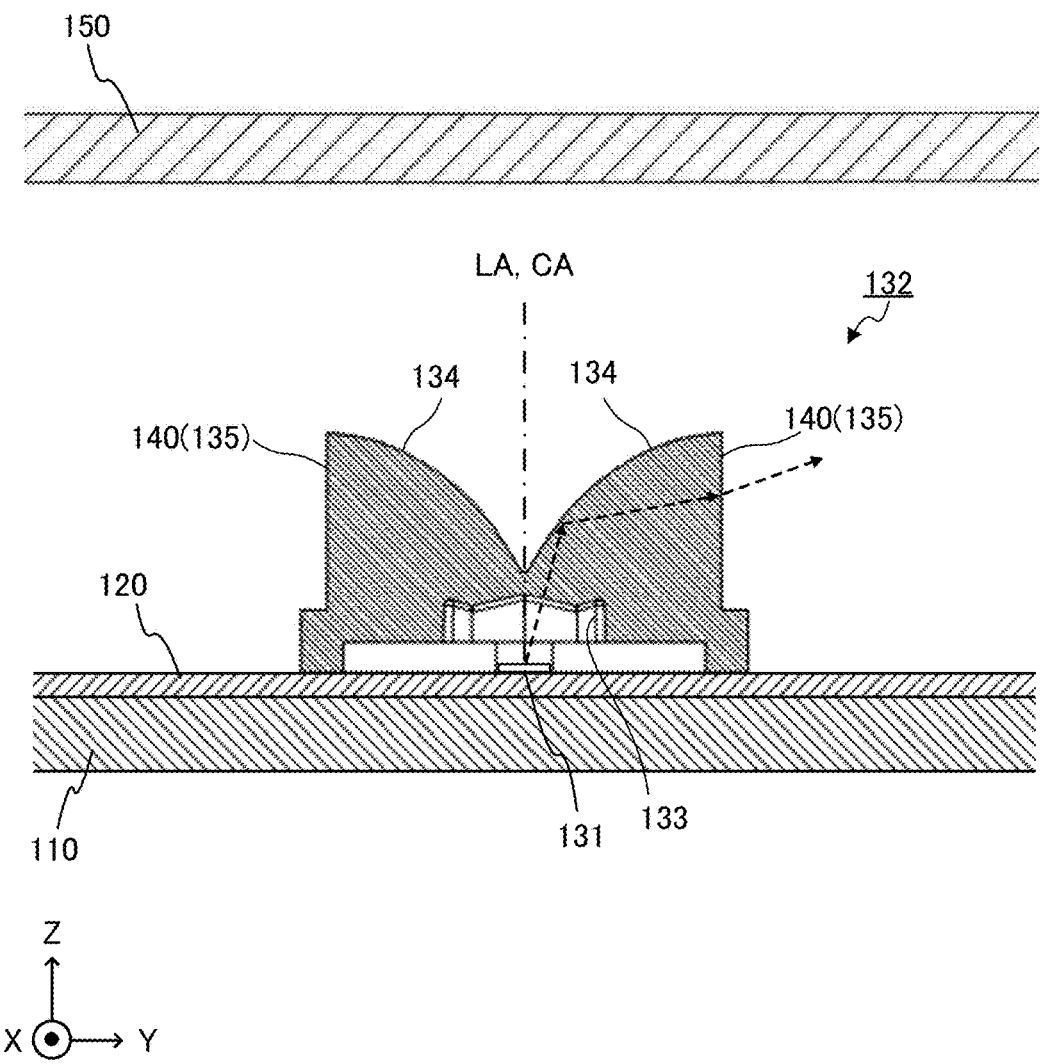
FIG. 4 is a partially enlarged sectional view of FIG. 3B.

FIGS. 2A to 3B illustrate a configuration of illumination apparatus 100 according to Embodiment 1. FIG. 2A is a plan view of illumination apparatus 100 and FIG. 2B is a front view of illumination apparatus 100. FIG. 3A is a sectional view taken along line 3A-3A of FIG. 2B, and FIG. 3B is a sectional view taken along line 3B-3B of FIG. 2A. FIG. 4 is an enlarged sectional view illustrating a part of FIG. 3B.

As illustrated in FIGS. 2A to 3B, illumination apparatus 100 includes housing 110, substrate 120, a plurality of light-emitting devices 130 and light diffusion plate 150.

Housing 110 is a cuboid box for housing substrate 120 and light-emitting devices 130 therein. At least a part of one surface of housing 110 is open. Housing 110 is composed of a bottom plate, the top plate opposite to the bottom plate, and four side plates connecting the bottom plate and the top plate. In the top plate, an opening of a rectangular shape that serves as a light emission region is formed. This opening is closed with light diffusion plate 150. The bottom plate and the top plate are disposed in parallel with each other. The height (distance) from the surface of the bottom plate to light diffusion plate 150 is, but not limited to, about 20 to 100 mm. Housing 110 is composed of a resin such as polymethylmethacrylate (PMMA) and polycarbonate (PC), a metal such as stainless steel and aluminum, or the like, for example.

Substrate 120 is a flat plate disposed on the bottom plate of housing 110 and configured to dispose light-emitting devices 130 in housing 110 at a predetermined interval. The surface of substrate 120 is configured to reflect, toward light diffusion plate 150, light arriving from light-emitting device 130.

Light-emitting devices 130 are disposed on substrate 120 in a line (in the Y-axis direction described later). The number of light-emitting devices 130 disposed on substrate 120 is not limited. The number of light-emitting devices 130 disposed on substrate 120 is appropriately set based on the size of the light emission region (light-emitting surface) defined by the opening of housing 110.

Each light-emitting device 130 includes light-emitting element 131 and light flux controlling member 132. Each light-emitting device 130 is disposed such that the light axis (light axis LA of light-emitting element 131 described later) of light emitted from light-emitting element 131 is set along the normal to the surface of substrate 120.

Light-emitting element 131 is a light source of illumination apparatus 100 (and light-emitting device 130). Light-emitting element 131 is disposed on substrate 120. Light-emitting element 131 is a light-emitting diode (LED), for example. The color of the light emitted by light-emitting element 131 in light-emitting device 130 is not limited. In the present embodiment, for example, an SMD light-emitting element including a light emission part that emits blue light and a phosphor that covers the periphery of light emission part and converts the blue light emitted from light emission part into white light may be used.

Light flux controlling member 132 controls the distribution of light emitted from light-emitting element 131, and changes the travelling direction of the light to the plane direction of substrate 120, or more specifically, two opposite directions approximately perpendicular to light axis LA of light-emitting element 131. Light flux controlling member 132 is disposed over light-emitting element 131 in such a manner that central axis CA thereof matches light axis LA of light-emitting element 131 (see FIG. 4). The "light axis LA of light-emitting element 131" refers to a central light beam of a stereoscopic emission light flux from light-emitting element 131. The "central axis CA of light flux controlling member 12" refers to a symmetric axis of 2-fold rotational symmetry, for example. In the following description, the direction parallel to light axis LA of light-emitting devices 130 is referred to also as the Z-axis direction, the direction in which light-emitting devices 130 are aligned in a line in a plane perpendicular to the Z-axis direction is referred to also as the Y-axis direction, and the direction orthogonal to the Y-axis direction in a plane perpendicular to the Z-axis direction is referred to also as the X-axis direction.

The material of light flux controlling member 132 is not limited as long as light of a desired wavelength can pass therethrough. Examples of the material of light flux controlling member 132 include: optically transparent resins such as polymethylmethacrylate (PMMA), polycarbonate (PC), and epoxy resin (EP); and glass.

A main feature of illumination apparatus 100 according to Embodiment 1 is the configuration of light flux controlling member 132. Therefore, light flux controlling member 132 is elaborated later.

Light diffusion plate 150 is disposed to close the opening of housing 110. Light diffusion plate 150 is a plate-shaped member having light transparency and light diffusing property, and allows light emitted from emission surface 135 of light flux controlling member 132 to pass therethrough while diffusing the light. Light diffusion plate 150 can serve as a light-emitting surface of illumination apparatus 100, for example.

While the material of light diffusion plate 150 is not limited as long as the material can allow light emitted from emission surface 135 of light flux controlling member 132 to pass therethrough while diffusing the light, and the material of light diffusion plate 150 may be an optically transparent resin such as polymethylmethacrylate (PMMA), polycarbonate (PC), polystyrene (PS) and styrene methyl methacrylate copolymerization resin (MS). In order to provide a light diffusing property, minute irregularities are formed on the surface of light diffusion plate 150, or diffusing members such as beads are dispersed in light diffusion plate 150.

Illumination apparatus 100 according to Embodiment 1 emits light such that light emitted from each light-emitting element 131 is directed by light flux controlling member 132 in two opposite directions (in the Y-axis direction in FIG. 4) approximately perpendicular to light axis LA of light-emitting element 131 so as to illuminate light diffusion plate 150 over a wide range. The light emitted from each light flux controlling member 132 is further diffused by light diffusion plate 150, before being emitted to the outside. With this configuration, color unevenness and illuminance unevenness of illumination apparatus 100 can be suppressed.

Configuration of Light Flux Controlling Member

Figure 5A:
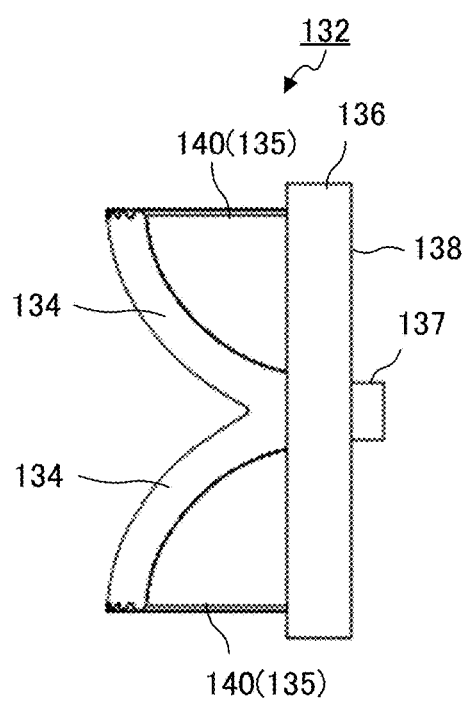
FIGS. 5A to 5C illustrate a configuration of a light flux controlling member according to Embodiment 1.
Figure 5B:
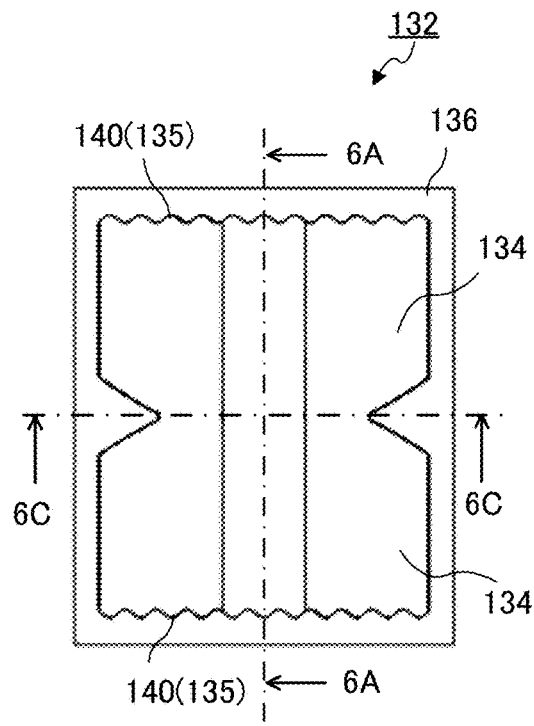
Figure 5C:
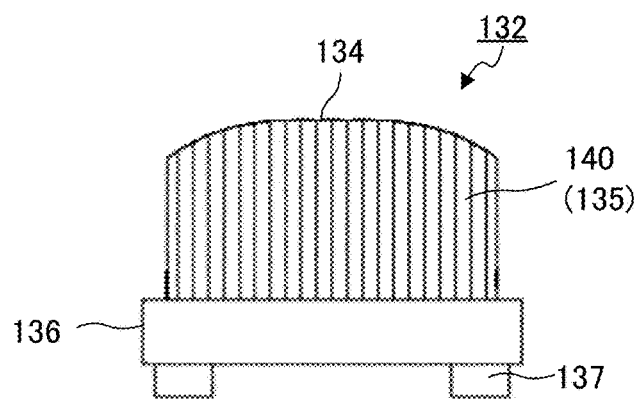
Figure 6A:
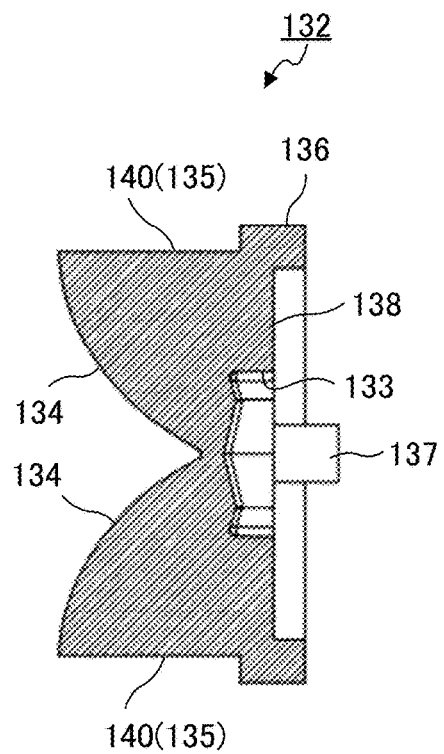
FIGS. 6A to 6C illustrate a configuration of the light flux controlling member according to Embodiment 1.
Figure 6B:
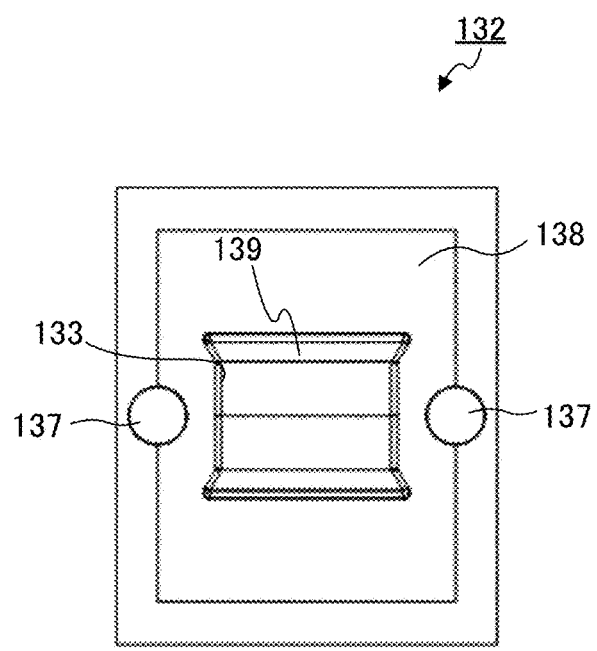
Figure 6C:
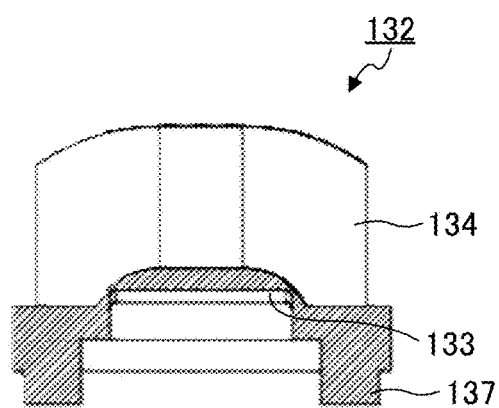

FIGS. 5A to 6C illustrate a configuration of light flux controlling member 132. FIG. 5A is a front view of light flux controlling member 132, FIG. 5B is a plan view of light flux controlling member 132, and FIG. 5C is a side view of light flux controlling member 132. FIG. 6A is a sectional view taken along line 6A-6A of FIG. 5B, FIG. 6B is a bottom view, and FIG. 6C is a sectional view taken along line 6C-6C of FIG. 5B.

Light flux controlling member 132 controls the distribution of light emitted from light-emitting element 131. As illustrated in FIGS. 6A to 6C, light flux controlling member 132 includes incidence surface 133, two reflection surfaces 134, two emission surfaces 135, flange part 136 and leg part 137.

A part of light emitted from light-emitting element 131 impinges on incidence surface 133. Incidence surface 133 is an inner surface of recess 139 formed at a center portion of the bottom surface (the surface on light-emitting element 131 side) 138 of light flux controlling member 132. The shape of recess 139 is not limited. Recess 139 may have a shape of an edged surface with a top surface and a side surface, or a shape of an edgeless curved surface such as a hemisphere shape or a semi-ellipsoid shape. In the present embodiment, recess 139 has a shape of an edged surface with a top surface and a side surface. The shape may have two or more top surfaces.

Two reflection surfaces 134 are disposed (on light diffusion plate 150 side) opposite light-emitting element 131 with incidence surface 133 therebetween. In addition, two reflection surfaces 134 reflect a part of light incident on incidence surface 133 in two opposite directions substantially perpendicular to light axis LA of light-emitting element 131, or specifically, the two opposite directions along the Y-axis direction in which light-emitting devices 130 are disposed in a line. In a cross-section including light axis LA of light-emitting element 131 (more specifically, a cross-section that includes the Z axis and is parallel to the Y axis), two reflection surfaces 134 are disposed such that the height from the bottom surface 138 (substrate 120) increases in the direction from light axis LA of light-emitting element 131 toward the end (emission surface 135) with respect to light axis LA of light-emitting element 131. More specifically, two reflection surfaces 134 are formed such that, in a cross-section including light axis LA of light-emitting element 131, the inclination of the tangent to the surface gradually decreases from light axis LA of light-emitting element 131 toward the end (emission surface 135).

Two emission surfaces 135 are disposed opposite to each other with two reflection surfaces 134 therebetween. Two emission surfaces 135 emit, to the outside, light from incidence surface 133 that directly impinges on emission surface 135 or is reflected by two reflection surfaces 134. Two emission surfaces 135 are provided with a plurality of first ridges 140 for suppressing color unevenness resulting from light-emitting element 131.

The shape of first ridge 140 in the cross-section perpendicular to light axis LA of light-emitting element 131 may be, but not limited to, a wavy shape, a triangular shape or a rectangular shape (including a trapezoidal shape).

As viewed from emission surface 135 side (as viewed along the Y-axis direction), the ridgeline of first ridge 140 is approximately parallel to light axis LA of light-emitting element 131. Here, the term "approximately parallel" means that, as viewed from emission surface 135 side, the angle between light axis LA of light-emitting element 131 and the ridgeline of first ridge 140 is 15 degrees or smaller, preferably, 0 degree. The reason for reducing the angle between light axis LA and the ridgeline of first ridge 140 as much as possible is to readily remove a molded article from the metal mold without complicating the structure of the shaping metal mold for light flux controlling member 132. When a metal mold structure that slides in a direction that intersects the mold removing direction can be employed, the limitation on the tilt angle to light axis LA can be eliminated. In addition, when light flux controlling member 132 is mounted to substrate 120, the angle between light axis LA and the ridgeline of first ridge 140 can be largely increased.

The "ridgeline" of first ridge 140 is a continuous line of the tip of the ridge, and is a line extending along the vertex of first ridge 140 in the cross-section perpendicular to light axis LA of light-emitting element 131. One or more "ridgelines" may be provided in each first ridge 140. For example, in the case where first ridge 140 has a wavy cross-sectional shape in the cross-section perpendicular to light axis LA of light-emitting element 131, the ridgeline is a line extending along the vertex of the wave. In the case where first ridge 140 has a trapezoidal cross-sectional shape in the cross-section perpendicular to light axis LA of light-emitting element 131, the ridgeline is each of two lines extending along two vertices of the trapezoid (intersections of the upper bottom and the legs).

In the cross-section perpendicular to light axis LA of light-emitting element 131, center-to-center distance a (the distance in the X-axis direction) of first ridges 140 may be equal to or different from each other. For example, in the cross-section perpendicular to light axis LA of light-emitting element 131, center-to-center distances a of first ridges 140 may gradually decrease in the direction away from the center of emission surface 135 in the X-axis direction. Preferably, center-to-center distances a of first ridges 140 are equal to one another from the viewpoint of suppressing color unevenness while achieving the desired light distribution. The term "center-to-center distances a of first ridges 140" means the distance between each center line of first ridge 140 in the cross-section perpendicular to light axis LA of light-emitting element 131 (see FIG. 7).

In the cross-section perpendicular to light axis LA of light-emitting element 131, heights b (the length in the Y-axis direction) of first ridges 140 may be equal to or different from each other. For example, in the cross-section perpendicular to light axis LA of light-emitting element 131, heights b of first ridges 140 may gradually decrease in the direction away from the center of emission surface 135 in the X-axis direction. Preferably, heights b of first ridges 140 are equal to one another from the viewpoint of suppressing color unevenness while achieving the desired light distribution. The term "height b of first ridge 140" in the cross-section perpendicular to light axis LA of light-emitting element 131 means a length corresponding to half the distance between straight line connecting the vertices of two ridges 140 adjacent to each other and a straight line connecting the valley bottom of a valley between the two ridges 140 and the valley bottoms of the two valleys adjacent to that valley in the cross-section perpendicular to light axis LA of light-emitting element 131 (see FIG. 7).

Heights b of first ridges 140 may be equal to or different from each other in the direction (the Z-axis direction) parallel to light axis LA of light-emitting element 131. For example, in the cross-section including light axis LA of light-emitting element 131, heights b of first ridges 140 may gradually decrease in the direction away from reflection surface 134 in the direction (the Z-axis direction) parallel to light axis LA of light-emitting element 131.

Preferably, the ratio a:b of center-to-center distance a to height b of first ridges 140 in the cross-section approximately perpendicular to light axis LA of light-emitting element 131 is 2:1 to 13:1. When a:b falls within the above-mentioned range, light emitted from two emission surfaces 135 can be slightly changed in the travelling direction without scattering the light, and thus the ease of suppression of color unevenness increases while achieving the desired light distribution. More preferably, in view of not only suppressing color unevenness, but also improving the illuminance distribution, the ratio of center-to-center distance a to height b of first ridges 140 in the cross-section perpendicular to light axis LA of light-emitting element 131 is a:b=5:1 to 11:1, or still more preferably, a:b=5:1 to 10:1.

Preferably, center-to-center distance a of first ridges 140 in the cross-section perpendicular to light axis LA of light-emitting element 131 is 0.125 mm to 4.000 mm. When center-to-center distance a of first ridges 140 falls within the above-mentioned range, the effect of suppressing color unevenness is easily achieved. More preferably, when the ratio of center-to-center distance a to height b of first ridges 140 is a:b=5:1 to 10:1, center-to-center distance a of first ridges 140 in the cross-section perpendicular to light axis LA of light-emitting element 131 is greater than 0.125 mm and 2.000 mm or smaller. The reason for this is that the effect of suppressing color unevenness is easily achieved with such a center-to-center distance a.

Figure 7:
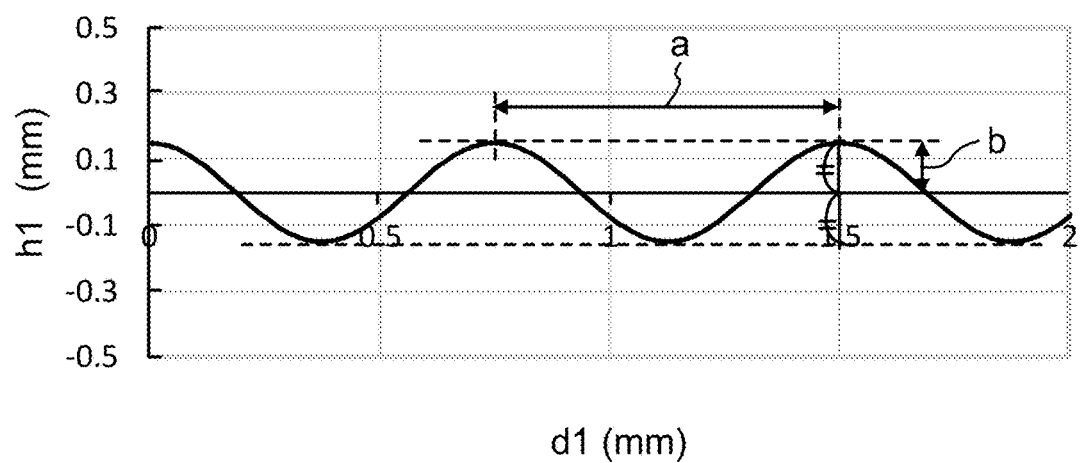
FIG. 7 illustrates an exemplary wavy shape of an emission surface.

FIG. 7 is a graph illustrating an exemplary cross-sectional shape of emission surface 135 of light flux controlling member 132 according to Embodiment 1 in the cross-section perpendicular to light axis LA of light-emitting element 131. In FIG. 7, the abscissa indicates distance d1 from the center of emission surface 135 of light flux controlling member 132 (the distance in the X-axis direction; mm), and the ordinate indicates height h1 of emission surface 135 of light flux controlling member 132 from the reference surface (the height in the Y-axis direction; mm). The reference surface is a line connecting each middle point between the vertex of first ridge 140 and the adjacent valley bottom in the cross-section perpendicular to light axis LA of light-emitting element 131.

As illustrated in FIG. 7, the cross-sectional shape of emission surface 135 of light flux controlling member 132 according to Embodiment 1 in the cross-section perpendicular to light axis LA of light-emitting element 131 may be set to meet Expression (1).

$$h1 = b \times \cos(2\pi d1/a) \qquad \text{Expression (1)}$$

(a: a center-to-center distance (mm) between first ridges 140, b: a height (mm) of first ridge 140, d1: a distance from the center of emission surface 135 of light flux controlling member 132 (the distance in the X-axis direction; mm), and h1: a height of emission surface 135 of light flux controlling member 132 from the reference surface (the height in the Y-axis direction; mm))

Flange part 136 is located between two emission surfaces 135 and the outer periphery part of bottom surface 138 of light flux controlling member 132, and is projected to the outside with respect to central axis CA. Flange part 136 has a substantially rectangular shape. While flange part 136 is not an essential component, flange part 136 eases handling and positioning of light flux controlling member 132. The thickness of flange part 136 is not limited, and may be set in accordance with the desired planar dimension of two emission surfaces 135, workability of flange part 136 and the like.

A plurality of leg parts 137 are substantially columnar members protruding from bottom surface 138 and a bottom portion of flange part 136 to light-emitting element 131 side in an outer periphery part of bottom surface 138 (rear surface) of light flux controlling member 132. Leg parts 137 support light flux controlling member 132 at an appropriate position with respect to light-emitting element 131 (see FIG. 6B). Leg parts 137 may be fit to holes formed in substrate 120 for the purpose of positioning in a direction parallel to XY plane direction.

Figure 8A:
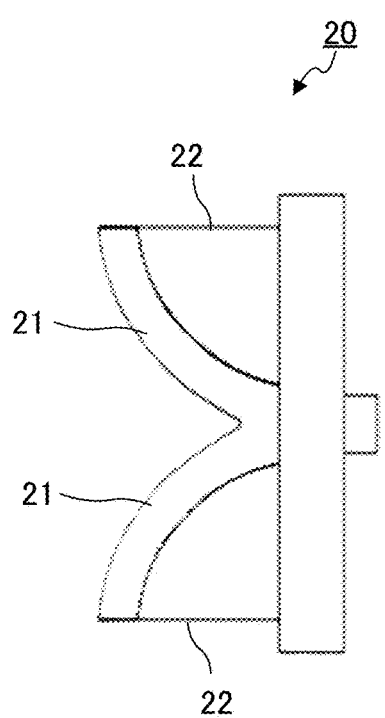
FIGS. 8A to 8C illustrate a configuration of a comparative light flux controlling member.
Figure 8B:
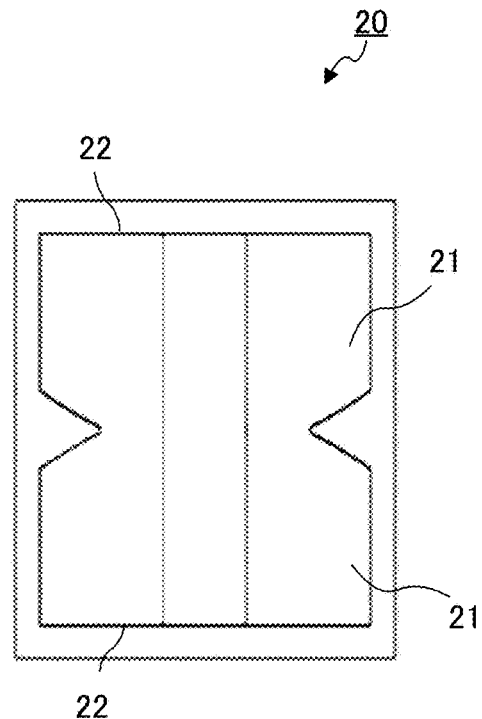
Figure 8C:
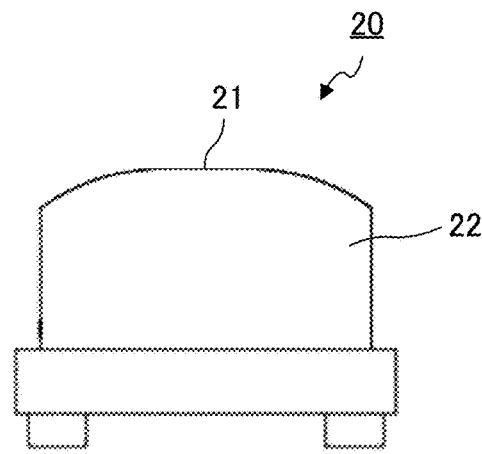

Operations of light flux controlling member 132 according to the present embodiment is described in comparison with a comparative light flux controlling member. FIGS. 8A to 8C illustrate a configuration of a comparative light flux controlling member. FIG. 8A is a front view of comparative light flux controlling member 20, FIG. 8B is a plan view of comparative light flux controlling member 20, and FIG. 8C is a side view of comparative light flux controlling member 20.

In comparative light flux controlling member 20, light emitted from light-emitting element 131 is entered into the member from the incidence surface (not illustrated in the drawing) and is then reflected by two reflection surfaces 21 such that the light travels in two opposite directions perpendicular to light-emitting element light axis LA, and is emitted from two emission surfaces 22 to the outside. Here, two emission surfaces 22 are smooth surfaces (see FIG. 8B) or rough surfaces (not illustrated in the drawing). In the case where two emission surfaces 22 are smooth surfaces, color unevenness resulting from light-emitting element 131 tends to be left unchanged. In the case where two emission surfaces 22 are rough surfaces, light emitted from emission surface 22 is scattered in a region around emission surface 22, and consequently the desired light distribution cannot be achieved.

In contrast, in light flux controlling member 132 according to the embodiment of the present embodiment, light emitted from light-emitting element 131 is reflected by two reflection surfaces 134 so as to travel in two opposite directions perpendicular to light axis LA of light-emitting element 131, and is then emitted to the outside from two emission surfaces 135. The light emitted from emission surface 135 is controlled such that the light reaches light diffusion plate 150 at a position remote from the light-emitting device 130 (see FIG. 4). Two emission surfaces 135 are provided with first ridges 140 (see FIG. 4 and FIG. 5B). With this configuration, the emission direction of light emitted from two emission surfaces 135 is moderately changed by first ridges 140 without being scattered, and thereafter the light is emitted to the outside. Thus, color unevenness can be sufficiently suppressed while appropriately controlling the distribution of light emitted from light-emitting element 131.

Simulation 1-1

In Simulation 1-1, the chromaticity Y value and the illuminance distribution on light diffusion plate 150 were analyzed with illumination apparatus 100 including light flux controlling members A-1 to A-6 and B-1 to B-4 according to Embodiment 1 in which the ratio of center-to-center distance a to height b and center-to-center distance a of first ridges 140 of emission surface 135 in the cross-section perpendicular to light axis LA of light-emitting element 131 were set as follows in light flux controlling member 132 illustrated in FIG. 5A to 6C. The analysis of the chromaticity Y value and the illuminance distribution were conducted with illumination apparatus 100 provided with only one light-emitting device 130.

For comparison, the chromaticity Y value and the illuminance distribution on the light diffusion plate were analyzed also with an illumination apparatus provided with comparative light flux controlling member (light flux controlling member 20 of FIGS. 8A to 8C) that is identical to light flux controlling member 132 illustrated in FIG. 5A to 6C except that two emission surfaces 135 include no first ridge 140.

Parameters of Emission Surface 135

Emission surface 135 provided with first ridge 140 was set such that the cross-sectional shape of emission surface 135 in the cross-section perpendicular to light axis LA of light-emitting element 131 meets Expression (1).

$$h1 = b \times \cos(2\pi d1/a) \qquad \text{Expression (1)}$$

a: Center-to-center distance (mm) between first ridges 140 b: Height (mm) of first ridge 140 d1: Distance from center of emission surface 135 of light flux controlling member 132 (mm)

h1: Height of emission surface 135 of light flux controlling member 132 from reference surface (mm)

Light flux controlling member A: center-to-center distance a:height b=2:1

Light flux controlling member A-1: center-to-center distance a=250 µm, height b=125 µm Light flux controlling member A-2: center-to-center distance a=500 µm, height b=250 µm Light flux controlling member A-3: center-to-center distance a=750 μm, height b=375 μm Light flux controlling member A-4: center-to-center distance a=1000 μm, height b=500 μm Light flux controlling member A-5: center-to-center distance a=1250 μm, height b=625 μm Light flux controlling member A-6: center-to-center distance a=1500 μm, height b=750 μm Light flux controlling member B: center-to-center distance a:height b=13:1

Figure 9A:
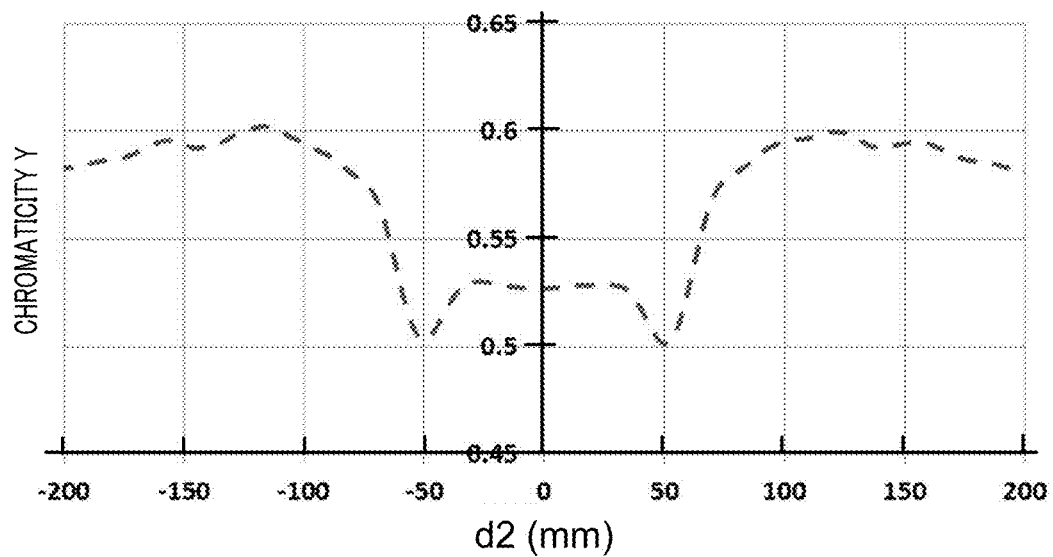
FIG. 9A is a graph illustrating an analysis result of the chromaticity Y value on a light diffusion plate in a comparative illumination apparatus using the light flux controlling member of FIG. 8.
Figure 9B:
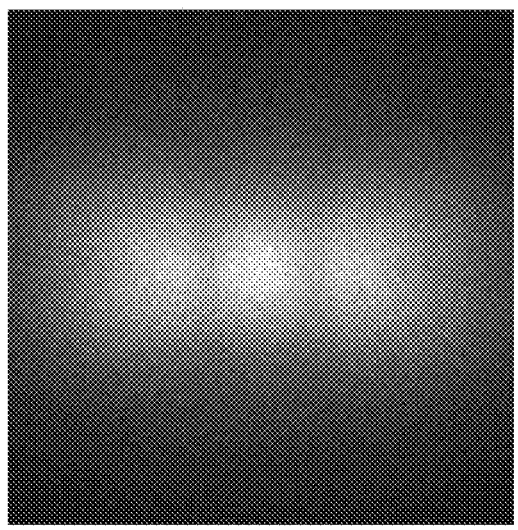
FIG. 9B illustrates an analysis result of the illuminance distribution on the light diffusion plate of the illumination apparatus.

Light flux controlling member B-1: center-to-center distance a=250 μm, height b=19 μm Light flux controlling member B-2: center-to-center distance a=500 μm, height b=38 μm Light flux controlling member B-3: center-to-center distance a=750 μm, height b=57 μm Light flux controlling member B-4: center-to-center distance a=1000 μm, height b=76 μm Other Common Parameters Outer diameter of light flux controlling member: 11.1 μm in the Y-axis direction, 9.2 μm in the X-axis direction Height of light-emitting element: 0.75 μm Size of light-emitting element: φ28 μm Distance between substrate 120 and light diffusion plate 150: 70 μm FIG. 9A is a graph illustrating an analysis result of the chromaticity Y value on the light diffusion plate in a comparative illumination apparatus using light flux controlling member 20 of FIG. 8, and FIG. 9B illustrates an analysis result of the illuminance distribution on the light diffusion plate of the illumination apparatus.

Figure 10A:
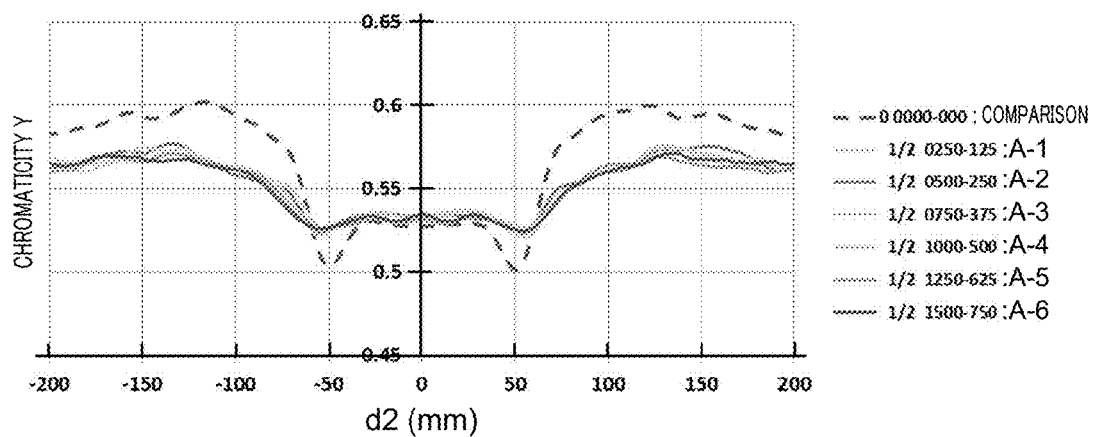
FIG. 10A is a graph illustrating an analysis result of the chromaticity Y value on light diffusion plates in illumination apparatuses using light flux controlling members A-1 to A-6 according to Embodiment 1.
Figure 10B:
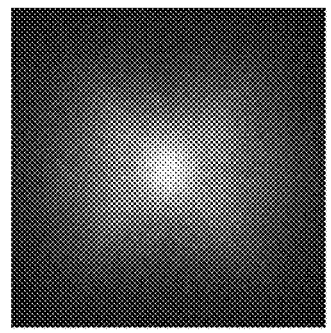
FIG. 10B illustrates an analysis result of the illuminance distribution on the light diffusion plate in the illumination apparatus using light flux controlling member A-1.
Figure 10C:
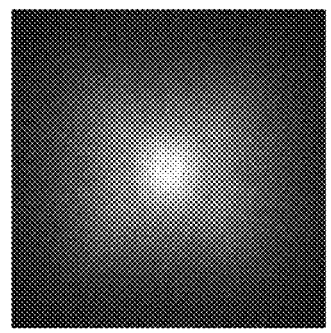
FIG. 10C illustrates an analysis result of the illuminance distribution on the light diffusion plate in the illumination apparatus using light flux controlling member A-6.

FIG. 10A is a graph illustrating an analysis result of the chromaticity Y value on light diffusion plate 150 in illumination apparatus 100 including light flux controlling members A-1 to A-6 according to Embodiment 1, FIG. 10B illustrates a result of an analysis of the illuminance distribution on light diffusion plate 150 in illumination apparatus 100 including light flux controlling member A-1, and FIG. 10C illustrates a result of an analysis of the illuminance distribution on light diffusion plate 150 in illumination apparatus 100 including light flux controlling member A-6.

Figure 11A:
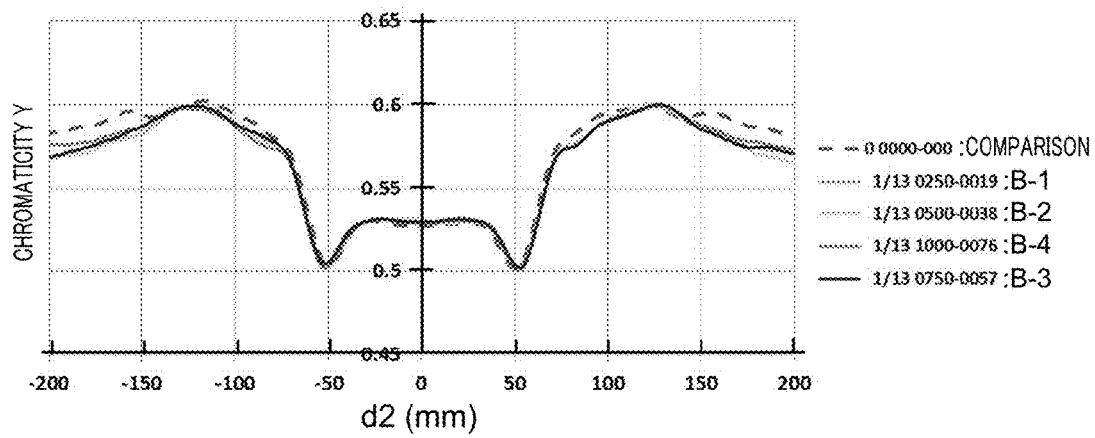
FIG. 11A is a graph illustrating an analysis result of the chromaticity Y value on light diffusion plates in illumination apparatuses using light flux controlling members B-1 to B-4 according to Embodiment 1.
Figure 11B:
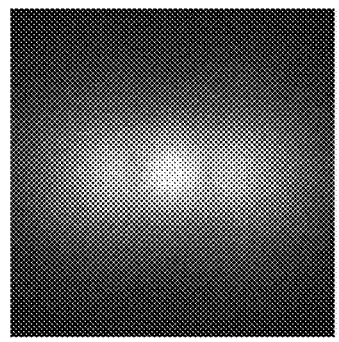
FIG. 11B illustrates an analysis result of the illuminance distribution on the light diffusion plate in the illumination apparatus using light flux controlling member B-1.
Figure 11C:
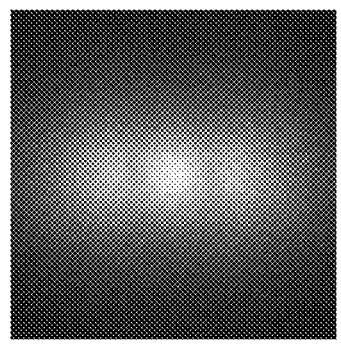
FIG. 11C illustrates an analysis result of the illuminance distribution on the light diffusion plate in the illumination apparatus using light flux controlling member B-3.

FIG. 11A is a graph illustrating an analysis result of the chromaticity Y value on light diffusion plate 150 in illumination apparatus 100 including light flux controlling members B-1 to B-4 according to Embodiment 1, FIG. 11B illustrates a result of an analysis of the illuminance distribution on light diffusion plate 150 in illumination apparatus 100 including light flux controlling member B-1, and FIG. 11C illustrates a result of an analysis of the illuminance distribution on light diffusion plate 150 in illumination apparatus 100 including light flux controlling member B-3.

In FIGS. 9A, 10A and 11A, the abscissa indicates distance d2 (the distance in the Y-axis direction; mm) from light axis LA of light-emitting element 131 in light diffusion plate 150, and the ordinate indicates the chromaticity Y value in light diffusion plate 150. In FIGS. 9B, 10B, 10C, 11B and 11C, the abscissa direction corresponds to the abscissa direction of FIGS. 9A, 10A and 11A.

As illustrated in FIG. 9A, in the illumination apparatus using comparative light flux controlling member 20, the rising edge of the chromaticity Y value at approximately 50 mm from light axis LA of light-emitting element 131 is steep and the rising height is high.

In contrast, as illustrated in FIGS. 10A and 11A, in illumination apparatus 100 including light flux controlling members A-1 to A-6 and B-1 to B-4 according to Embodiment 1, in particular in illumination apparatus 100 including light flux controlling members A-1 to A-6, the difference between the maximum value and the minimum value of the chromaticity Y value in the illuminance distribution on light diffusion plate 150 is smaller than that of the illumination apparatus using comparative light flux controlling member 20. In particular, in illumination apparatus 100 including light flux controlling members A-1 to A-6, the rising edge of the chromaticity Y value is moderate and the rising height is low at approximately 50 mm from light axis LA of light-emitting element 131.

As is clear from the above-mentioned results, light flux controlling members A-1 to A-6 and B-1 to B-4 according to Embodiment 1 in which first ridges 140 are provided in both two emission surfaces 135 can suppress color unevenness in comparison with comparative light flux controlling member 20 in which two emission surfaces 135 are provided with no first ridge 140.

In addition, as FIGS. 10B, 10C, 11B and 11C show, the illuminance distribution of the illumination apparatus using light flux controlling members A-1 to A-6 and B-1 to B-4 according to Embodiment 1 is favorable. Any of light flux controlling members A-1 to A-6 and B-1 to B-4 may be appropriately selected depending on which of the light distribution characteristic and the suppression of color unevenness is prioritized.

Simulation 1-2

In Simulation 1-2, the chromaticity Y value and the illuminance distribution on light diffusion plate 150 were further analyzed with light flux controlling members C-3 to C-8 and D-1 to D-4 in which the ratio of center-to-center distance a to height b and center-to-center distance a of first ridges 140 of emission surface 135 in the cross-section perpendicular to light axis LA of light-emitting element 131 were set as follows. The parameters other than the parameters of emission surface 135 were set as in Simulation 1-1.

Parameters of Emission Surface 135

Light flux controlling member C: center-to-center distance a:height b=5:1

Light flux controlling member C-3: center-to-center distance a=250 μm, height b=50 μm Light flux controlling member C-4: center-to-center distance a=500 μm, height b=100 μm Light flux controlling member C-5: center-to-center distance a=750 μm, height b=150 μm Light flux controlling member C-6: center-to-center distance a=1000 μm, height b=200 μm Light flux controlling member C-7: center-to-center distance a=1250 μm, height b=250 μm Light flux controlling member C-8: center-to-center distance a=1500 μm, height b=300 μm Light flux controlling member D: center-to-center distance a:height b=11:1

Figure 12A:
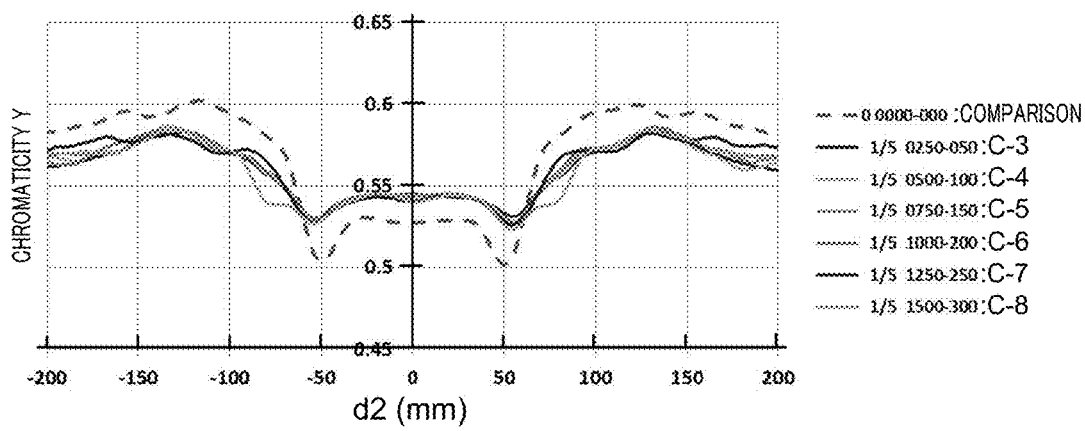
FIG. 12A is a graph illustrating an analysis result of the chromaticity Y value on light diffusion plates in illumination apparatuses using light flux controlling members C-3 to C-8 according to Embodiment 1.
Figure 12B:
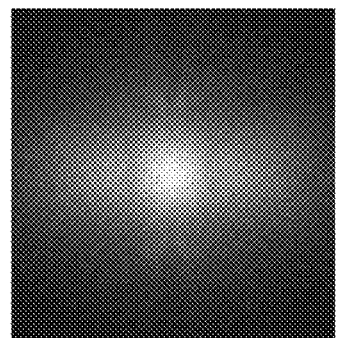
FIG. 12B illustrates an analysis result of the illuminance distribution on the light diffusion plate in the illumination apparatus using light flux controlling member C-3.
Figure 12C:
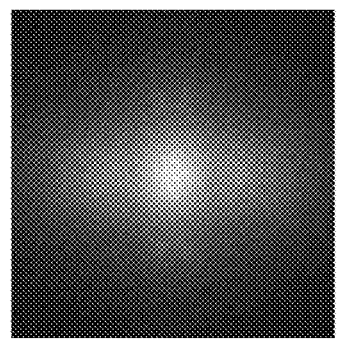
FIG. 12C illustrates an analysis result of the illuminance distribution on the light diffusion plate in the illumination apparatus using light flux controlling member C-8.

Light flux controlling member D-1: center-to-center distance a=250 μm, height b=22 μm Light flux controlling member D-2: center-to-center distance a=500 μm, height b=45 μm Light flux controlling member D-3: center-to-center distance a=750 μm, height b=68 μm Light flux controlling member D-4: center-to-center distance a=1000 μm, height b=90 μm FIG. 12A is a graph illustrating an analysis result of the chromaticity Y value on the light diffusion plate 150 in illumination apparatus 100 according to Embodiment 1 including light flux controlling members C-3 to C-8, FIG. 12B illustrates a result of an analysis of the illuminance distribution on light diffusion plate 150 in illumination apparatus 100 including light flux controlling member C-3, and FIG. 12C illustrates a result of an analysis of the illuminance distribution on light diffusion plate 150 in illumination apparatus 100 including light flux controlling member C-8.

Figure 13A:
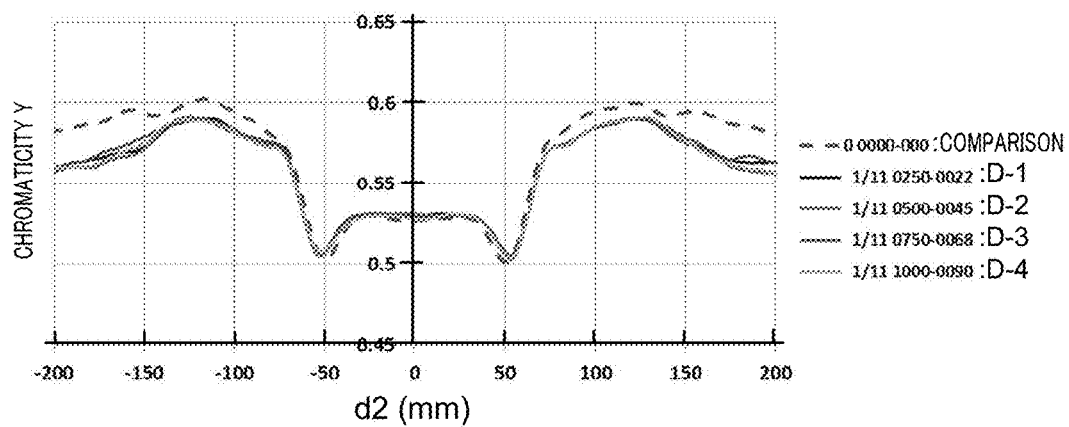
FIG. 13A is a graph illustrating an analysis result of the chromaticity Y value on light diffusion plates in illumination apparatuses using light flux controlling members D-1 to D-4 according to Embodiment 1.
Figure 13B:
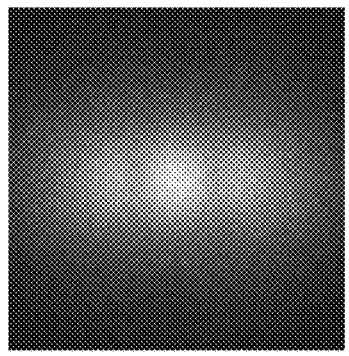
FIG. 13B illustrates an analysis result of the illuminance distribution on the light diffusion plate in the illumination apparatus using light flux controlling member D-1.
Figure 13C:
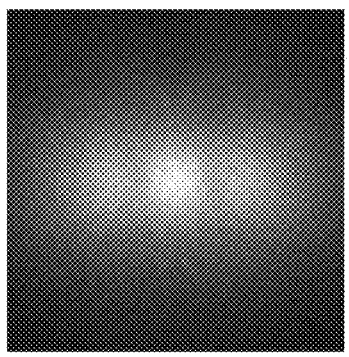
FIG. 13C illustrates an analysis result of the illuminance distribution on the light diffusion plate in the illumination apparatus using light flux controlling member D-4.

FIG. 13A is a graph illustrating an analysis result of the chromaticity Y value on light diffusion plate 150 in illumination apparatus 100 including light flux controlling members D-1 to D-4 according to Embodiment 1, FIG. 13B illustrates a result of an analysis of the illuminance distribution on light diffusion plate 150 in illumination apparatus 100 including light flux controlling member D-1, and FIG. 13C illustrates a result of an analysis of the illuminance distribution on light diffusion plate 150 illumination apparatus 100 including light flux controlling member D-4.

In FIG. 12A and FIG. 13A, the abscissa indicates distance d2 (the distance in the Y-axis direction; mm) from light axis LA of light-emitting element 131 in light diffusion plate 150, and the ordinate indicates the chromaticity Y value in light diffusion plate 150. In FIGS. 12B, 12C, 13B and 13C, the abscissa direction corresponds to the abscissa direction of FIGS. 12A and 13A.

As illustrated in FIG. 12A, in illumination apparatus 100 according to Embodiment 1 including light flux controlling members C-3 to C-8 and D-1 to D-4, the rising edge of the chromaticity Y value is moderate and the rising height is low at distance d2 (mm), approximately 50 mm, from light axis LA of light-emitting element 131, and it is thus possible to suppress color unevenness in comparison with the illumination apparatus using comparative light flux controlling member 20 illustrated in FIG. 9A.

Further, as illustrated in FIGS. 12B, 12C, 13B and 13C, in the illuminance distribution of illumination apparatus 100 including light flux controlling members C-3 to C-8 and D-1 to D-4 according to Embodiment 1, the light spreading in the Y-axis direction is wider than in the illuminance distribution of illumination apparatus 100 including light flux controlling members A-1 to A-6 and B-1 to B-4 illustrated in FIGS. 10B, 10C, 11B and 11C. As is clear from the above-mentioned results, by setting the ratio of center-to-center distance a and height b of first ridges 140 in two emission surfaces 135 such that center-to-center distance a:height b=5:1 to 11:1, the illuminance distribution can be further enhanced while suppressing color unevenness as much as possible.

Simulation 1-3

In Simulation 1-3, the chromaticity Y value and the illuminance distribution on light diffusion plate 150 were further analyzed with light flux controlling members C-1 to C-11 and E-1 to E-11 in which the ratio of center-to-center distance a to height b and center-to-center distance a of first ridges 140 of emission surface 135 in the cross-section perpendicular to light axis LA of light-emitting element 131 were set as follows. The parameters other than the parameters of emission surface 135 were set as in Simulation 1-1.

Parameters of Emission Surface 135

Light flux controlling member C: center-to-center distance a:height b=5:1

Light flux controlling member C-1: center-to-center distance a=100 μm, height b=20 μm Light flux controlling member C-2: center-to-center distance a=125 μm, height b=25 μm Light flux controlling member C-3: center-to-center distance a=250 μm, height b=50 μm Light flux controlling member C-4: center-to-center distance a=500 μm, height b=100 μm Light flux controlling member C-5: center-to-center distance a=750 μm, height b=150 μm Light flux controlling member C-6: center-to-center distance a=1000 μm, height b=200 μm Light flux controlling member C-7: center-to-center distance a=1250 μm, height b=250 μm Light flux controlling member C-8: center-to-center distance a=1500 μm, height b=300 μm Light flux controlling member C-9: center-to-center distance a=2000 μm, height b=400 μm Light flux controlling member C-10: center-to-center distance a=3000 μm, height b=600 μm Light flux controlling member C-11: center-to-center distance a=4000 μm, height b=800 μm Light flux controlling member E: center-to-center distance a:height b=10:1

Figure 14A:
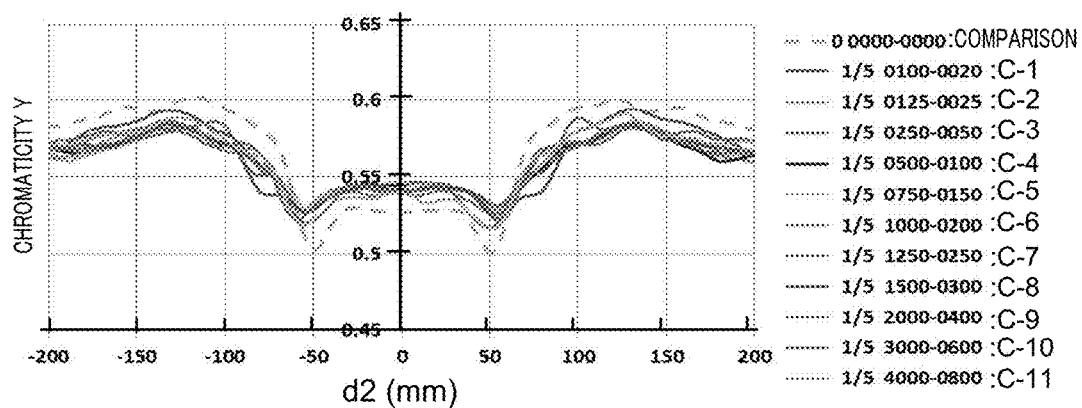
FIG. 14A is a graph illustrating an analysis result of the chromaticity Y value on light diffusion plates in illumination apparatuses using light flux controlling members C-1 to C-11 according to Embodiment 1.
Figure 14B:
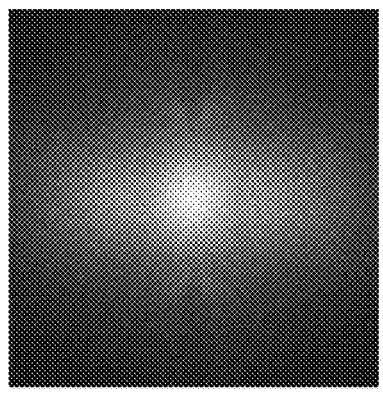
FIG. 14B illustrates an analysis result of the illuminance distribution on the light diffusion plate the illumination apparatus using light flux controlling member C-2.
Figure 14C:
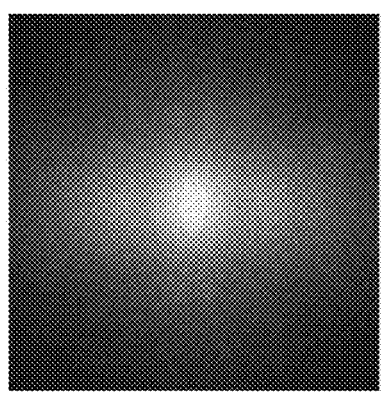
FIG. 14C illustrates an analysis result of the illuminance distribution on the light diffusion plate in the illumination apparatus using light flux controlling member C-9.

Light flux controlling member E-1: center-to-center distance a=100 μm, height b=10 μm Light flux controlling member E-2: center-to-center distance a=125 μm, height b=12 μm Light flux controlling member E-3: center-to-center distance a=250 μm, height b=25 μm Light flux controlling member E-4: center-to-center distance a=500 μm, height b=50 μm Light flux controlling member E-5: center-to-center distance a=750 μm, height b=75 μm Light flux controlling member E-6: center-to-center distance a=1000 μm, height b=100 μm Light flux controlling member E-7: center-to-center distance a=1250 μm, height b=125 μm Light flux controlling member E-8: center-to-center distance a=1500 μm, height b=150 μm Light flux controlling member E-9: center-to-center distance a=2000 μm, height b=200 μm Light flux controlling member E-10: center-to-center distance a=3000 μm, height b=300 μm Light flux controlling member E-11: center-to-center distance a=4000 μm, height b=400 μm FIG. 14A is a graph illustrating an analysis result of the chromaticity Y value on the light diffusion plate 150 in illumination apparatus 100 including light flux controlling members C-1 to C-11 according to Embodiment 1, FIG. 14B illustrates a result of an analysis of the illuminance distribution on light diffusion plate 150 illumination apparatus 100 including light flux controlling member C-2, and FIG. 14C illustrates a result of an analysis of the illuminance distribution on light diffusion plate 150 in illumination apparatus 100 including light flux controlling member C-9.

Figure 15A:
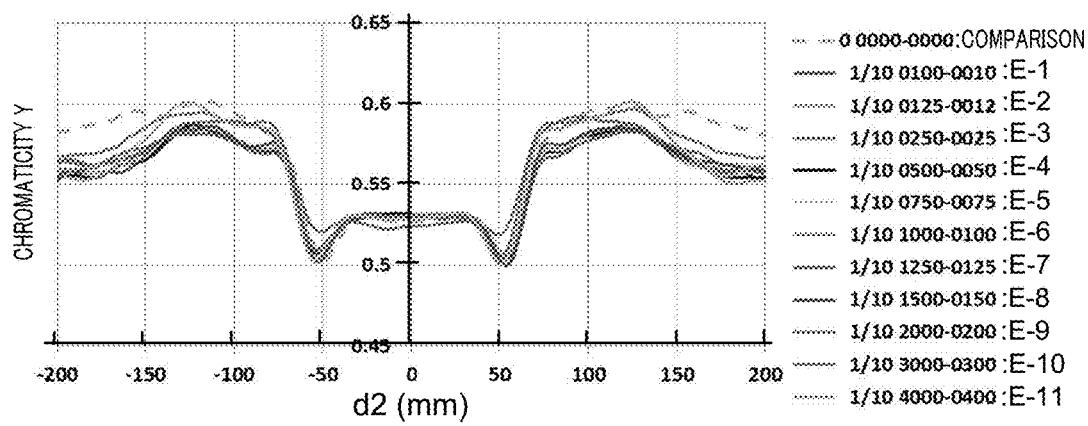
FIG. 15A is a graph illustrating an analysis result of the chromaticity Y value on light diffusion plates in illumination apparatuses using light flux controlling members E-1 to E-11 according to Embodiment 1.
Figure 15B:
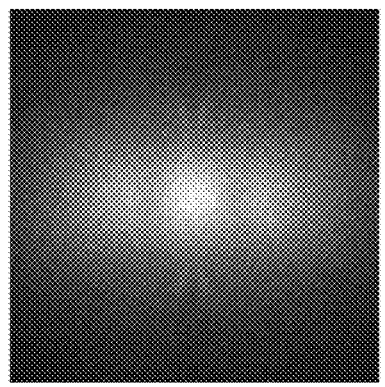
FIG. 15B illustrates an analysis result of the illuminance distribution on the light diffusion plate in the illumination apparatus using light flux controlling member E-2.
Figure 15C:
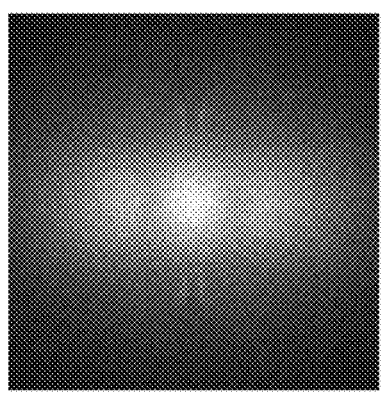
FIG. 15C illustrates an analysis result of the illuminance distribution on the light diffusion plate in the illumination apparatus using light flux controlling member E-9.

FIG. 15A is a graph illustrating an analysis result of the chromaticity Y value on light diffusion plate 150 in illumination apparatus 100 including light flux controlling members E-1 to E-11 according to Embodiment 1, FIG. 15B illustrates a result of an analysis of the illuminance distribution on light diffusion plate 150 in illumination apparatus 100 including light flux controlling member E-2, and FIG. 15C illustrates a result of an analysis of the illuminance distribution on light diffusion plate 150 in illumination apparatus 100 including light flux controlling member E-9.

In FIGS. 14A and 15A, the abscissa indicates distance d2 (the distance in the Y-axis direction; mm) from light axis LA of light-emitting element 131 in light diffusion plate 150, and the ordinate indicates the chromaticity Y value in light diffusion plate 150. In FIGS. 14B, 14C, 15B and 15C, the abscissa direction corresponds to the abscissa direction of FIGS. 14A and 15A.

As illustrated in FIGS. 14A and 15A, in the illumination apparatus using light flux controlling members C-1 to C-11 and E-1 to E-11 according to Embodiment 1, in particular in the illumination apparatus using light flux controlling members C-2 to C-9 and E-2 to E-9 in which center-to-center distance a of first ridges 140 is 125 to 2000 μm, the rising edge of the chromaticity Y value is moderate and the rising height is low at approximately 50 mm from light axis LA of light-emitting element 131 and it is thus possible to suppress color unevenness in comparison with the illumination apparatus using comparative light flux controlling member 20 illustrated in FIG. 8.

In addition, as illustrated in FIGS. 14B and 15B, in the illumination apparatus using light flux controlling members C-2, C-9, E-2 and E-9 according to Embodiment 1, the light is spread in the Y-axis direction.

As is clear from the above-mentioned results, by setting the ratio of center-to-center distance a and height b of first ridges 140 in emission surface 135 such that center-to-center distance a:height b=5:1 to 11:1 (preferably, 5:1 to 10:1) and that center-to-center distance a is 125 to 2000 μm, the illuminance distribution can be further increased while significantly suppressing color unevenness.

Effect

As described above, in light flux controlling member 132 according to Embodiment 1, first ridges 140 are provided in two emission surfaces 135. With this configuration, the emission direction of light emitted from light-emitting element 131 can be appropriately changed while expanding the light in two opposite directions approximately perpendicular to light axis LA, and color unevenness can be suppressed while maintaining the desired light distribution characteristics.

Embodiment 2

Figure 16A:
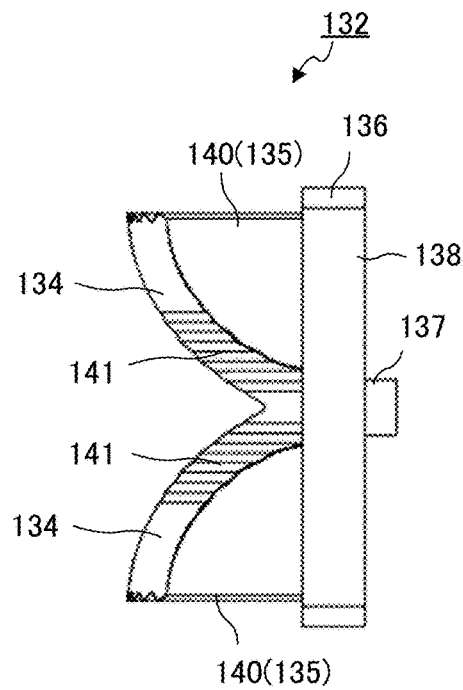
FIGS. 16A to 16C illustrate a configuration of a light flux controlling member according to Embodiment 2.
Figure 16B:
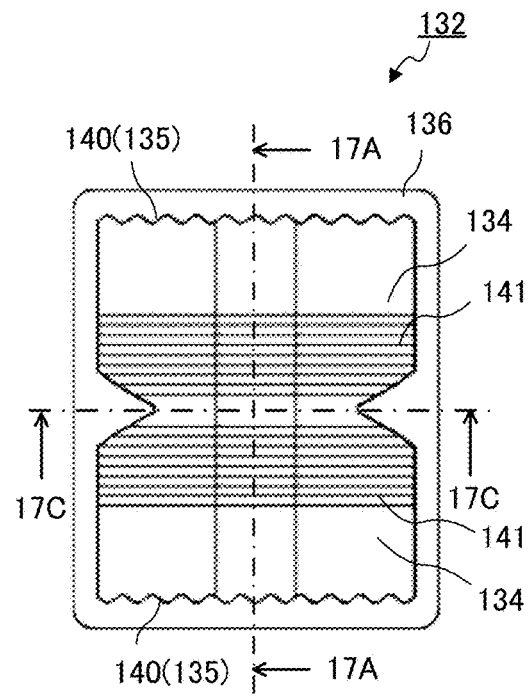
Figure 16C:
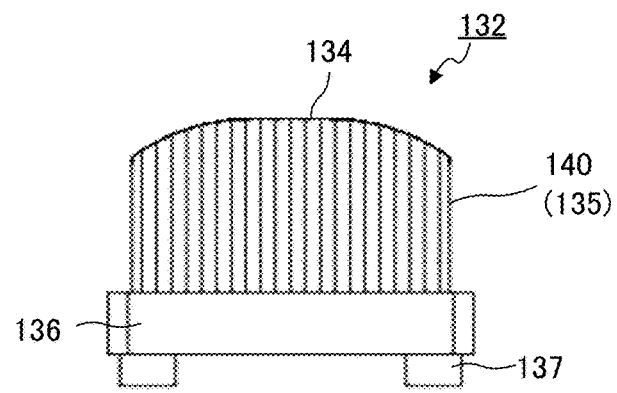
Figures 17A, 17B:
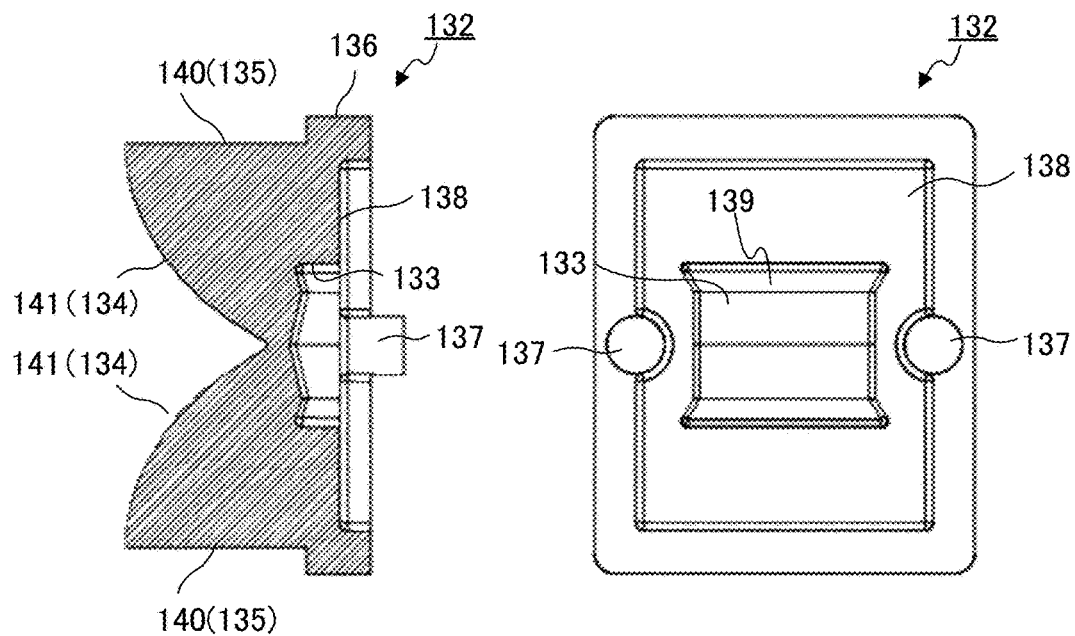
FIGS. 17A to 17C illustrate a configuration of the light flux controlling member according to Embodiment 2.
Figure 17C:
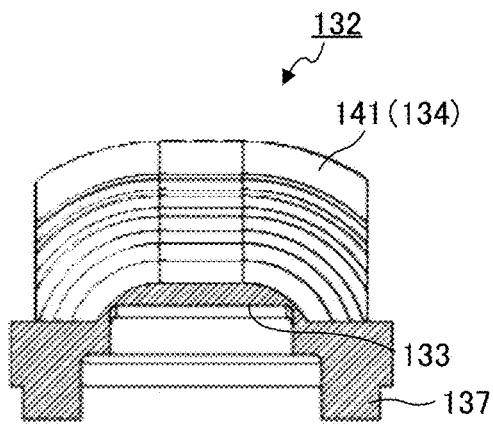

Next, with reference to FIG. 16A to FIG. 17C, light flux controlling member 132 according to Embodiment 2 is described. FIGS. 16A to 17C illustrate a configuration of a light flux controlling member according to Embodiment 2. FIG. 16A is a front view of light flux controlling member 132, FIG. 16B is a plan view of light flux controlling member 132, and FIG. 16C is a side view of light flux controlling member 132. FIG. 17A is a sectional view taken along line 17A-17A of FIG. 16B, FIG. 17B is a bottom view, and FIG. 17C is a sectional view taken along line 17C-17C of FIG. 16B. Light flux controlling member 132 according to Embodiment 2 differs from light flux controlling member 132 according to Embodiment 1 in that two reflection surfaces 134 include a plurality of second ridges 141. In view of this, the components identical to those of light flux controlling member 132 according to Embodiment 1 are denoted with the same reference signs, and the description thereof will be omitted.

Light flux controlling member 132 according to Embodiment 2 is provided with second ridges 141 in at least a part of two reflection surfaces 134, more preferably, in a region of two reflection surfaces 134 where light emitted from light-emitting element 131 reaches in the cross-section including light axis LA of light-emitting element 131 (in the cross-section that includes light axis LA of light-emitting element 131 and is parallel to the Y-axis direction).

The region of two reflection surfaces 134 where light emitted from light-emitting element 131 reaches is a region at and near light axis LA of light-emitting element 131 in two reflection surfaces 134 (see FIGS. 16A and 16B). Second ridges 141 are formed such that the ridgelines of second ridges 141 have a positional relationship of skew lines with respect to the ridgelines of first ridges 140. The positional relationship of skew lines is a positional relationship in which the ridgelines do not intersect and are not parallel. Each ridgeline of second ridge 141 is a continuous line of the tip of the ridge, and a line extending along the vertex of second ridge 141 in the cross-section including light axis LA of light-emitting element 131. When light flux controlling member 132 is viewed from reflection surface 134 side (viewed in Z-axis direction), the ridgelines of second ridges 141 may be approximately parallel to the X-axis direction (see FIGS. 16A and 16B), or may be a part of an annular shape around light axis LA (not illustrated in the drawing).

The cross-sectional shapes of second ridges 141 in the cross-section including light axis LA of light-emitting element 131 may be, but not limited to, a wavy shape, a triangular shape or a rectangular shape (including a trapezoidal shape).

In the cross-section including light axis LA of light-emitting element 131, center-to-center distance a' (the distance in the Y-axis direction) between second ridges 141 may be equal to or different from each other. For example, in the cross-section including light axis LA of light-emitting element 131, center-to-center distance a of first ridges 140' may gradually decrease in the direction away from light axis LA of light-emitting element 131 along the Y-axis direction. The "center-to-center distance a between second ridges 141" is the distance between the center lines of two second ridges 141 adjacent to each other in the cross-section including light axis LA of light-emitting element 131.

In the cross-section including light axis LA of light-emitting element 131, heights b' (the length in the Z direction) of second ridges 141 may be equal to or different from each other. For example, in the cross-section including light axis LA of light-emitting element 131, heights b' of second ridges 141 may gradually decrease in the direction away from light axis LA of light-emitting element 131 along the Y-axis direction. The "height b' of second ridge 141" means a length corresponding to half the distance between a straight line connecting the vertices of two ridges 141 adjacent to each other and a straight line connecting the valley bottoms of a valley formed between the two ridges 141 and other two valleys adjacent to that valley in the cross-section including light axis LA of light-emitting element 131.

As described above, in light flux controlling member 132 according to Embodiment 2, first ridges 140 are disposed in two emission surfaces 135, and further, second ridges 141 are disposed in two reflection surfaces 134. With this configuration, the travelling direction of light can be changed not only by first ridge 140, but also by second ridge 141, and thus color unevenness can be further suppressed. In addition, color unevenness can be further suppressed since the light travelling direction in the X-axis direction can be changed at first ridge 140, and the light travelling direction in the Z-axis direction can be changed at second ridge 141.

Simulation 2

In Simulation 2, the chromaticity Y value and the illuminance distribution on light diffusion plate 150 were analyzed with illumination apparatus 100 using light flux controlling member G according to Embodiment 2 in which center-to-center distance a and height b of first ridges 140 in two emission surfaces 135 are set as follows and second ridges 141 of two reflection surfaces 134 were set as follows in the light flux controlling member of FIG. 18A. Parameters other than the parameters of emission surface 135 and reflection surface 134 were set as in Simulation 1-1.

Parameters of Emission Surface 135

Center-to-center distance a of first ridge 140: height b=7.5:1

Center-to-center distance a of first ridge 140=750 m, height b=100 μm

Parameters of Reflection Surface 134

First, the cross-sectional shapes of two reflection surfaces 134 of light flux controlling member G in the cross-section including light axis LA of light-emitting element 131 were set.

Figure 18A:
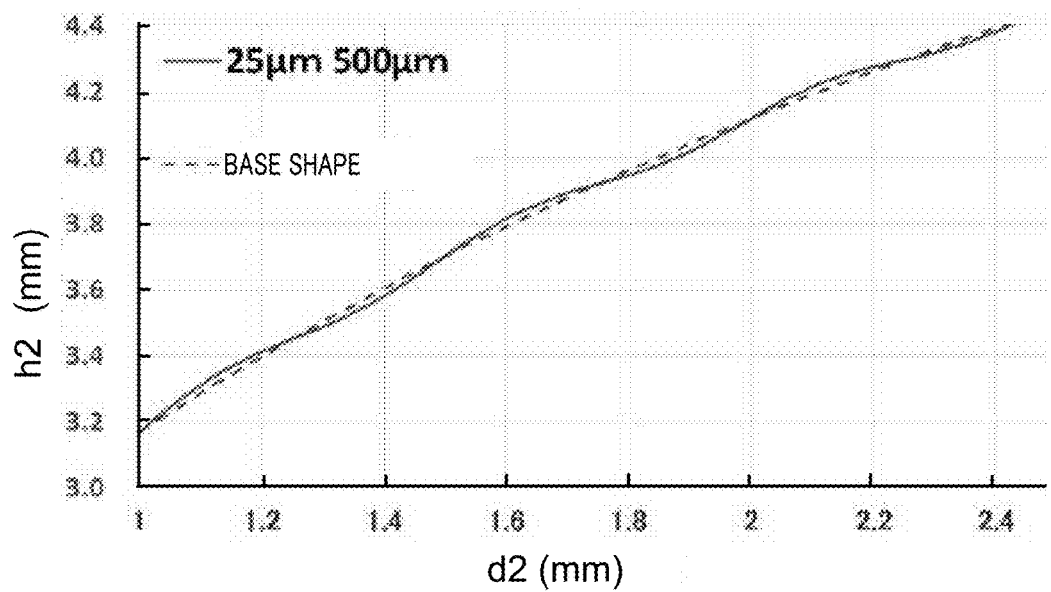
FIG. 18A is a graph illustrating a cross-sectional shape of a reflection surface of light flux controlling member G in a cross-section including light-emitting element light axis LA.
Figure 18B:
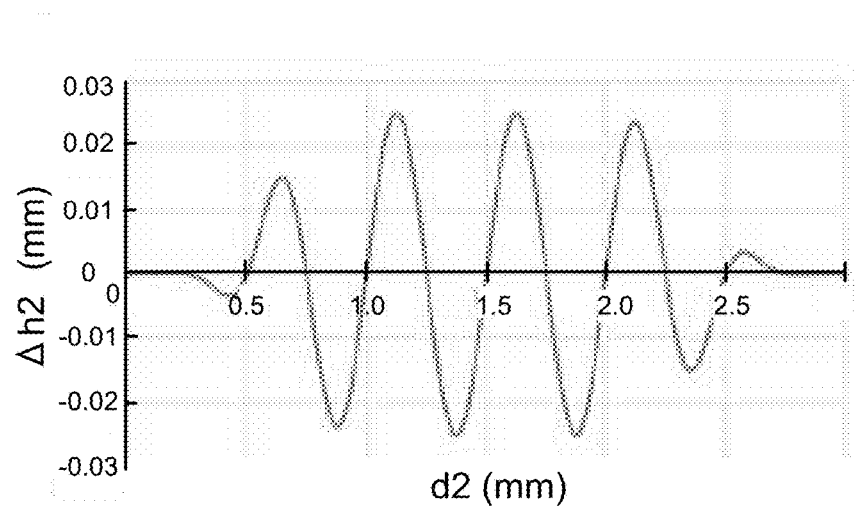
FIG. 18B is a graph illustrating a result ($\Delta h1$) obtained by subtracting a setting value of a cross-sectional shape of a reflection surface of a light flux controlling member including no second ridge from a setting value of a cross-sectional shape of a reflection surface of light flux controlling member G including a second ridge in a cross-section including light-emitting element light axis LA.

FIG. 18A is a graph illustrating a part of the cross-sectional shape of reflection surface 134 of light flux controlling member G in the cross-section including light axis LA of light-emitting element 131. FIG. 18B is a graph illustrating a result (Δh2; mm) obtained by subtracting the analysis result of the cross-sectional shape of reflection surface 134 of light flux controlling member 132 of FIGS. 6A to 6C including no second ridge 141 from the analysis result of the cross-sectional shape of reflection surface 134 of light flux controlling member G of FIGS. 17A to 17C including second ridge 141 in the cross-section including light axis LA of light-emitting element 131.

In FIGS. 18A and 18B, the abscissa indicates distance d2 (the distance in the Y-axis direction; mm) from light axis LA of light-emitting element 131. The ordinate of FIG. 18A indicates height h2 (height in the Z-axis direction; mm) from bottom surface 138 with respect to a point where light axis LA of light-emitting element 131 intersects in reflection surface 134. The ordinate of FIG. 18B indicates Δh2 (the height in the Z-axis direction; mm) obtained by subtracting the cross-sectional shape of reflection surface 134 of the light flux controlling member of FIG. 6 including no second ridge 141 from the cross-sectional shape of reflection surface 134 of light flux controlling member G including second ridge 141.

a': center-to-center distance of second ridges 141 (mm)

b': height of second ridge 141 (the length in the Z direction; mm)

Center-to-center distance a' of second ridges 141: height b'=20:1

Center-to-center distance a' of second ridges 141=500 μm, height b'=25 μm

Figure 19A:
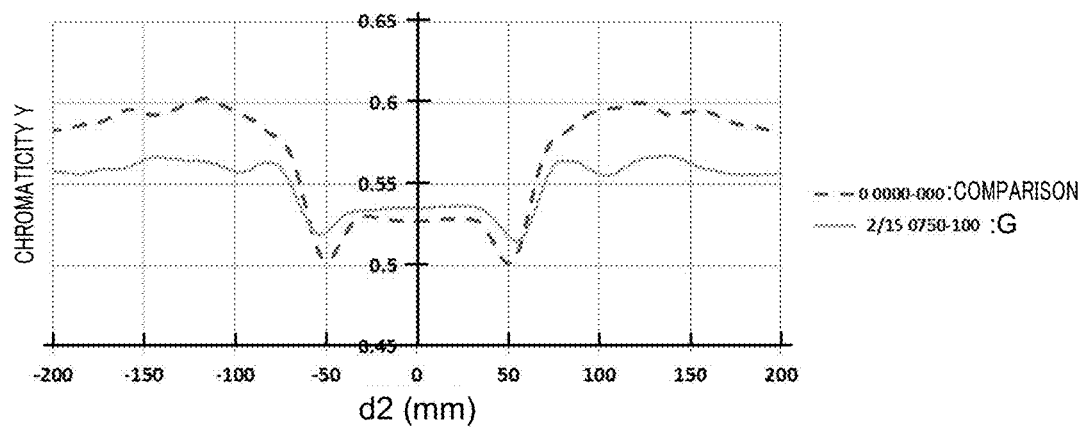
FIG. 19A is a graph illustrating an analysis result of the chromaticity Y value on a light diffusion plate in the illumination apparatus using light flux controlling member G of according to Embodiment 2.
Figure 19B:
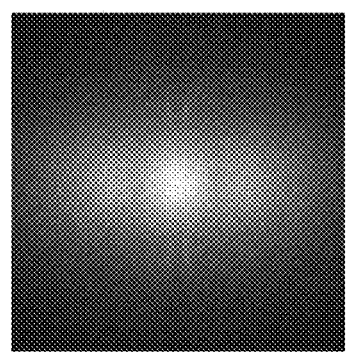
FIG. 19B illustrates an analysis result of the illuminance distribution on the light diffusion plate of the illumination apparatus.

FIG. 19A is a graph illustrating an analysis result of the chromaticity Y value on light diffusion plate 150 in the illumination apparatus using light flux controlling member G of according to Embodiment 2, and FIG. 19B illustrates a result of an analysis of the illuminance distribution on light diffusion plate 150 in the illumination apparatus.

In FIG. 19A, the abscissa indicates distance d2 (the distance in the Y-axis direction; mm) from light axis LA of light-emitting element 131 in light diffusion plate 150, and the ordinate indicates the chromaticity Y value in light diffusion plate 150. The abscissa direction of FIG. 19B corresponds to the abscissa direction of FIG. 19A.

As illustrated in FIG. 19A, in the illumination apparatus using light flux controlling member G of according to Embodiment 2, the rising edge of the chromaticity Y value is moderate and the rising height is low at approximately 50 mm from light axis LA of light-emitting element 131, and it is thus possible to suppress color unevenness in comparison with the illumination apparatus using comparative light flux controlling member 20 illustrated in FIG. 9A.

In addition, as illustrated in FIG. 19A, in the illumination apparatus using light flux controlling member G of according to Embodiment 2, the rising edge of the chromaticity Y value is moderate and the rising height is low at approximately 50 mm from light axis LA of light-emitting element 131, and color unevenness can be significantly suppressed in comparison with the illumination apparatuses using light flux controlling members C and E according to Embodiment 1 illustrated in FIG. 14A and FIG. 15A.

In addition, as illustrated in FIG. 19B, the light expansion in the Y-axis direction in the illuminance distribution of the illumination apparatus using light flux controlling member G of according to Embodiment 2 is equal to or greater than that of the illumination apparatus using a comparative light flux controlling member.

As is clear from the above-mentioned results, in the case where first ridges 140 of emission surfaces 135 of the same setting value are provided, reflection surface 134 provided with second ridge 141 can suppress color unevenness than reflection surface 134 provided with no second ridge 141.

Effect

As described above, light flux controlling member 132 according to Embodiment 2 is provided with not only first ridges 140 in two emission surfaces 135, but also second ridges 141 in two reflection surfaces 134. With this configuration, the reflection direction and/or the emission direction can be adjusted also by with second ridge 141, and color unevenness can be suppressed while maintaining the desired light distribution characteristics in comparison with light flux controlling member 132 according to Embodiment 1.

Embodiment 3

Figure 21A:
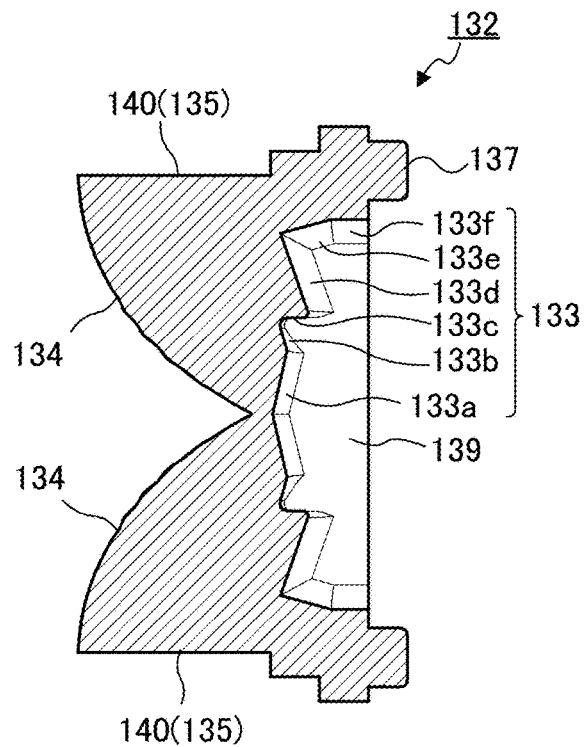
FIGS. 21A to 21C illustrate a configuration of the light flux controlling member according to Embodiment 3.
Figure 21B:
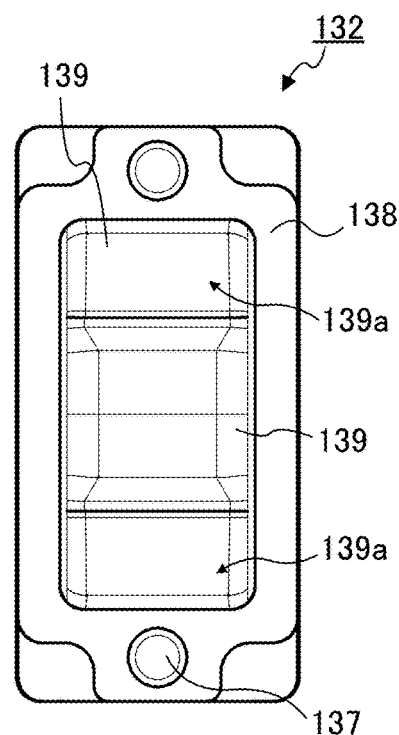
Figure 21C:
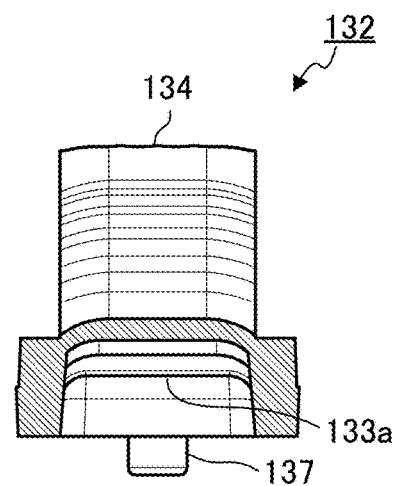

Next, light flux controlling member 132 according to Embodiment 3 is described with reference to FIGS. 20A to 21C. FIGS. 20A to 21C illustrate a configuration of the light flux controlling member according to Embodiment 3. FIG. 20A is a front view of light flux controlling member 132, FIG. 20B is a plan view of light flux controlling member 132, and FIG. 20C is a side view of light flux controlling member 132. FIG. 21A is a sectional view taken along line 21A-21A of FIG. 20B, FIG. 21B is a bottom view, and FIG. 21C is a sectional view taken along line 21C-21C of FIG. 20B. Light flux controlling member 132 according to Embodiment 3 differs from light flux controlling member 132 according to Embodiment 2 in that the width in X-axis direction is small, two leg parts 137 are disposed opposite to each other in the Y-axis direction, and recess 139 of a different shape is provided. In view of this, the components identical to those of light flux controlling member 132 according to Embodiment 2 are denoted with the same reference signs, and the description thereof will be omitted.

Light flux controlling member 132 according to Embodiment 3 has a small width in the X-axis direction. With such a configuration, two leg parts 137 are disposed opposite to each other in the Y-axis direction (see FIGS. 20B and 21B).

Recess 139 of light flux controlling member 132 according to Embodiment 3 has a shape obtained by thickness-reducing portions adjacent to the both end portions of recess 139 in the Y-axis direction in light flux controlling member 132 according to Embodiment 2 (see FIG. 21A). That is, in the direction away from light axis LA of light-emitting element 131 in the Y-axis direction, incidence surface 133, which is the inner surface of recess 139, includes two first top surfaces 133a, two second top surfaces 133b, two first side surfaces 133c, two third top surfaces 133d, two second side surfaces 133e and two third side surfaces 133f. A region defined by a virtual plane (not illustrated in the drawing) obtained by extending first side surface 133c, third top surface 133d, second side surface 133e, third side surface 133f and bottom surface 138 corresponds to the thickness-reducing portion (thickness-reducing portion 139a). That is, third top surface 133d, second side surface 133e and third side surface 133f are surfaces formed by the thickness-reducing. Although the number of the top surfaces and the side surfaces is not limited, six top surfaces and six side surfaces are provided in Embodiment 3.

Third top surface 133d may be a level surface or an inclined surface. In the present embodiment, third top surface 133d is an inclined surface that is disposed such that the height thereof from bottom surface 138 increases from light axis LA of light-emitting element 131 toward the end (emission surface 135) in a cross-section that includes light axis LA of light-emitting element 131 and is parallel to the Y axis.

Effect

As described above, light flux controlling member 132 according to Embodiment 3 has a small width in the X-axis direction. With this configuration, light flux controlling member 132 according to Embodiment 3 provides an effect similar to that of the light flux controlling member 132 according to Embodiment 2, and further, light flux controlling member 132 according to Embodiment 3 can be downsized. Further, light flux controlling member 132 according to Embodiment 3 includes thickness-reducing portion 139a. With this configuration, the shaping cycle can be shortened, and shaping shrinkage (shaping shrinkage after mold removal) in the manufacture of the light flux controlling member can be reduced, and thus, the light flux controlling member 132 that can suppress defects in the external appearance due to shrinkage can be efficiently produced.

Embodiment 4

Figures 22A, 22B:
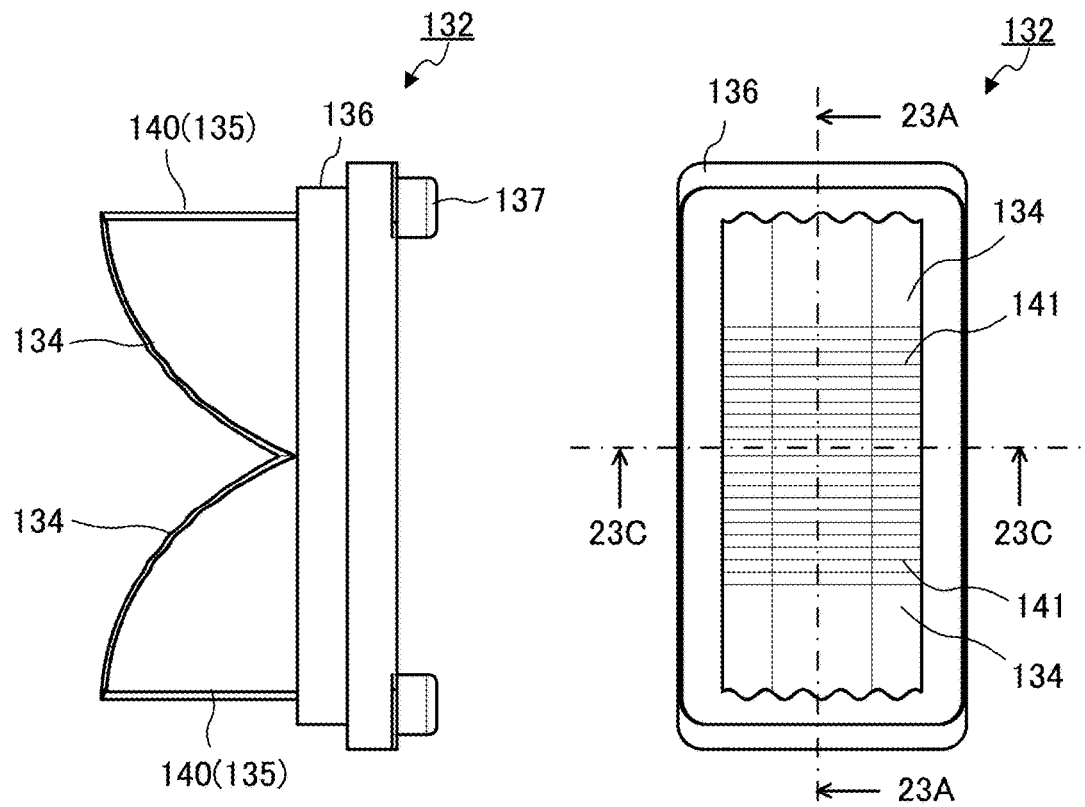
FIGS. 22A to 22C illustrate a configuration of a light flux controlling member according to Embodiment 4.
Figure 22C:
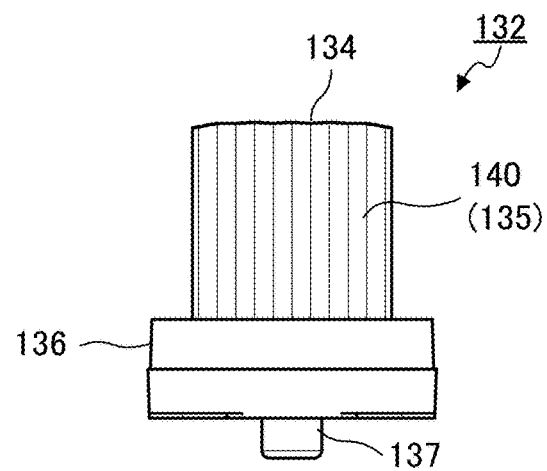
Figure 23A:
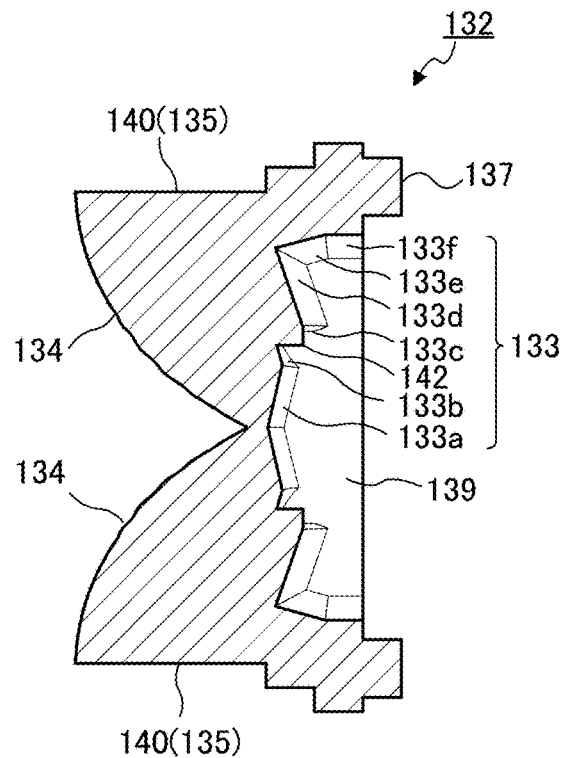
FIGS. 23A to 23C illustrate a configuration of the light flux controlling member according to Embodiment 4.
Figure 23B:
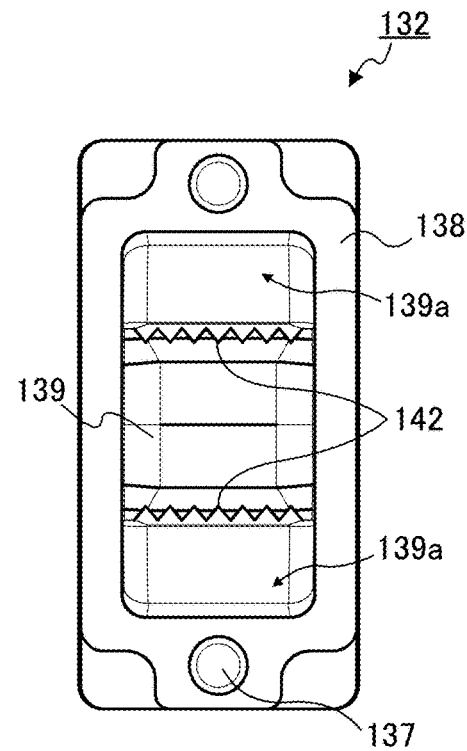
Figure 23C:
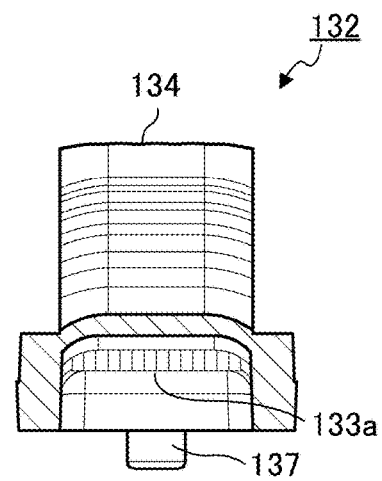

Next, with reference to FIGS. 22A to 23C, light flux controlling member 132 according to Embodiment 4 is described. FIGS. 22A to 23C illustrate a configuration of the light flux controlling member according to Embodiment 4. FIG. 22A is a front view of light flux controlling member 132, FIG. 22B is a plan view of light flux controlling member 132 and FIG. 22C is a side view of light flux controlling member 132. FIG. 23A is a sectional view taken along line 23A-23A of FIG. 22B, FIG. 23B is a bottom view and FIG. 23C is a sectional view taken along line 23C-23C of FIG. 22B. Light flux controlling member 132 according to Embodiment 4 differs from light flux controlling member 132 according to Embodiment 3 in that a plurality of third ridges 142 are additionally provided in first side surface 133c. In view of this, the components identical to those of light flux controlling member 132 according to Embodiment 3 are denoted with the same reference signs, and the description thereof will be omitted.

In light flux controlling member 132 according to Embodiment 4, third ridges 142 are disposed in two first side surfaces 133c.

From the view point of injection molding, it is preferable that third ridge 142 is disposed in such a manner as to allow for mold removal. In the present embodiment, third ridge 142 is disposed such that the ridgeline of third ridge 142 is approximately parallel to light axis LA of light-emitting element 131 as viewed from light axis LA of light-emitting element 131. The term "approximately parallel" means here that the angle between light axis LA of light-emitting element 131 and the ridgeline of third ridge 142 is 15 degrees or smaller, preferably, 0 degree.

The shape of third ridge 142 in the cross-section perpendicular to light axis LA of light-emitting element 131 may be, but not limited to, a wavy shape, a triangular shape or a rectangular shape (including a trapezoidal shape).

In the cross-section perpendicular to light axis LA of light-emitting element 131, the center-to-center distance (the distance in the X-axis direction) of third ridges 142 may be equal to or different from each other. The "center-to-center distance of third ridges 142" is the distance between each center line of third ridges 142 in the cross-section perpendicular to light axis LA of light-emitting element 131. Preferably, the center-to-center distance of third ridges 142 in the cross-section perpendicular to light axis LA of light-emitting element 131 is set such that the effect described later (an effect of scattering light reaching first side surface 133c with third ridge 142) is achieved.

In the cross-section perpendicular to light axis LA of light-emitting element 131, the heights (the lengths in the Y-axis direction) of third ridges 142 may be equal to or different from each other. The "height of third ridge 142" in the cross-section perpendicular to light axis LA of light-emitting element 131 means a length corresponding to half the distance between straight line connecting the vertices of two third ridges 142 adjacent to each other and a straight line connecting the valley bottoms of a valley formed between the two third ridges 142 and other two valleys adjacent to that valley in the cross-section perpendicular to light axis LA of light-emitting element 131. Preferably, the heights of third ridges 142 are set such that the effect described later (an effect of scattering light reaching first side surface 133c with third ridge 142) is achieved.

Figure 24:
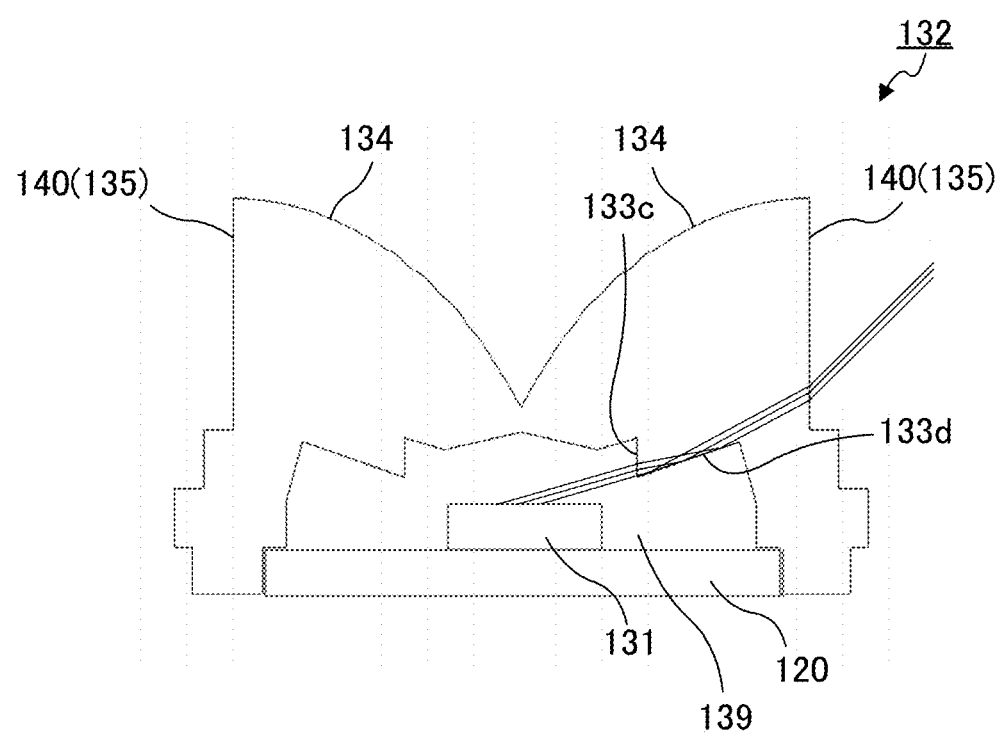
FIG. 24 illustrates light paths in the light flux controlling member according to Embodiment 3.

Operations of light flux controlling member 132 according to Embodiment 4 are described in comparison with light flux controlling member 132 according to Embodiment 3. FIG. 24 illustrates light paths in light flux controlling member 132 according to Embodiment 3.

As illustrated in FIG. 24, in light flux controlling member 132 according to Embodiment 3, light from light-emitting element 131 that is incident on first side surface 133c tends to be reflected upward by third top surface 133d. With this configuration, light reflected by third top surface 133d tends to be emitted upward from emission surface 135, and tends to reach light diffusion plate 150 in a region close to light-emitting device 130. That is, the amount of light that reaches light diffusion plate 150 in a region close to light-emitting device 130 increases, and therefore the luminance is locally increased in a region close to light-emitting device 130 (in the graph FIG. 25 described later, distance d2 in the Y-axis direction is approximately 50 mm), and consequently, in some situation slight luminance unevenness (luminance unevenness due to light reflected by third top surface 133d) is caused depending on the size and/or the light-emitting state of light-emitting element 131.

In contrast, in light flux controlling member 132 according to Embodiment 4, third ridges 142 are disposed in two first side surfaces 133c. With this configuration, light emitted from light-emitting element 131 is scattered by third ridges 142 (in particular, light is scattered in the X-axis direction). As a result, light that is entered from first side surface 133c can be reduced, and accordingly light reflected by third top surface 133d can be reduced. Thus, luminance unevenness due to light reflected by third top surface 133d can be suppressed.

Simulation 3

In Simulation 3, the illuminance distribution on light diffusion plate 150 was analyzed with illumination apparatus 100 including light flux controlling member H according to Embodiment 4 in which the center-to-center distance and the heights of third ridges 142 were set as follows in light flux controlling member of FIG. 23A. For comparison, the illuminance distribution on light diffusion plate 150 was analyzed also in illumination apparatus 100 including light flux controlling member I (light flux controlling member 132 of FIG. 21A) that is identical to light flux controlling member H according to Embodiment 4 except that third ridge 142 is not provided. Note that parameters other than first side surface 133c were set as in Simulation 2.

Parameters of First Side Surface 133c

Center-to-center distance of third ridges 142=650 μm, height=240 μm

Figure 25:
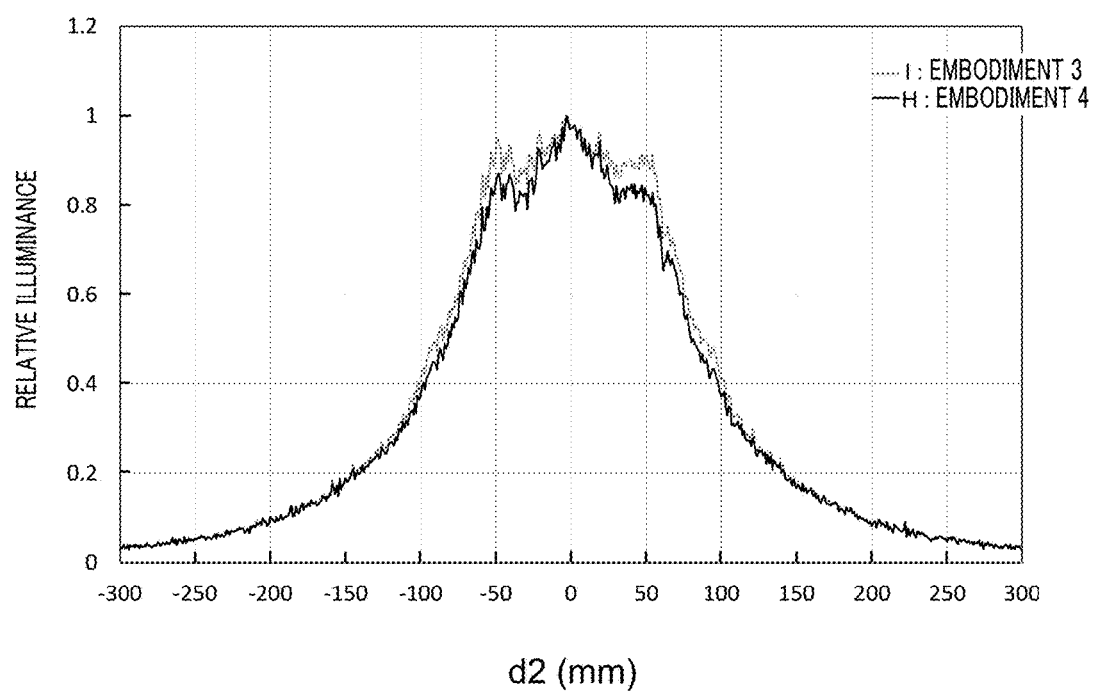
FIG. 25 is a graph illustrating an analysis result of an illuminance distribution on a light diffusion plate in an illumination apparatus using light flux controlling member H according to Embodiment 4.

FIG. 25 illustrates a result of an analysis of the illuminance distribution on light diffusion plate 150 in the illumination apparatus using light flux controlling member H according to Embodiment 4. In FIG. 25, the abscissa indicates distance d2 (the distance in the Y-axis direction; mm) from light axis LA of light-emitting element 131 in light diffusion plate 150, and the ordinate indicates the relative illuminance relative to the maximum illuminance value set to 1 in light diffusion plate 150.

As illustrated in FIG. 25, in the illumination apparatus using light flux controlling member H according to Embodiment 4, the rising edge of the relative illuminance at approximately 50 mm from light axis LA of light-emitting element 131 is smaller and the luminance unevenness can be suppressed in comparison with the illumination apparatus using light flux controlling member I according to Embodiment 3.

Effect

As described above, in light flux controlling member 132 according to Embodiment 4, third ridges 142 are disposed in two first side surfaces 133c. With this configuration, light flux controlling member 132 according to Embodiment 4 has an effect similar to that of the light flux controlling member 132 according to Embodiment 3, and further, light flux controlling member 132 according to Embodiment 4 can suppress luminance unevenness due to light reflected by third top surface 133d.

Note that, while first ridges 140 are provided in the entirety of two emission surfaces 135 of light flux controlling member 132 in Embodiments 1 to 4, the present invention is not limited to this, and first ridges 140 may be provided in a part of two emission surfaces 135.

While first ridges 140 are provide in two plane emission surfaces 135 in Embodiments 1 to 4, the present invention is not limited to this, and first ridges 140 may be provided in two convex or concave emission surfaces 135.

While first ridge 140 provided in two emission surfaces 135 has a smooth surface in Embodiments 1 to 4, the present invention is not limited to this, and the surface of first ridge 140 may be roughened as long as light distribution can be appropriately controlled.

While two emission surfaces 135 are approximately parallel to (or, not tilted to) light axis LA of light-emitting element 131 in the cross-section including light axis LA of light-emitting element 131 in Embodiments 1 to 4, the present invention is not limited to this, and two emission surfaces 135 may be slightly tilted to light axis LA of light-emitting element 131. For example, in the cross-section including light axis LA of light-emitting element 131, emission surface 135 may be tilted toward light axis LA of light-emitting element 131 in the direction away from light-emitting element 131 along the Z axis. The inclination angle of emission surface 135 to light axis LA of light-emitting element 131 in the cross-section including light axis LA of light-emitting element 131 may be 0 to 10 degrees, for example.

While light-emitting devices 130 in illumination apparatus 100 are disposed in a line in Embodiments 1 to 4, the present invention is not limited to this, and light-emitting devices 130 may be disposed in two or more lines.

While illumination apparatus 100 is a line illuminator in Embodiments 1 to 4, the present invention is not limited to this, and illumination apparatus 100 may be any sign such as a channel letter sign.

Figure 26:
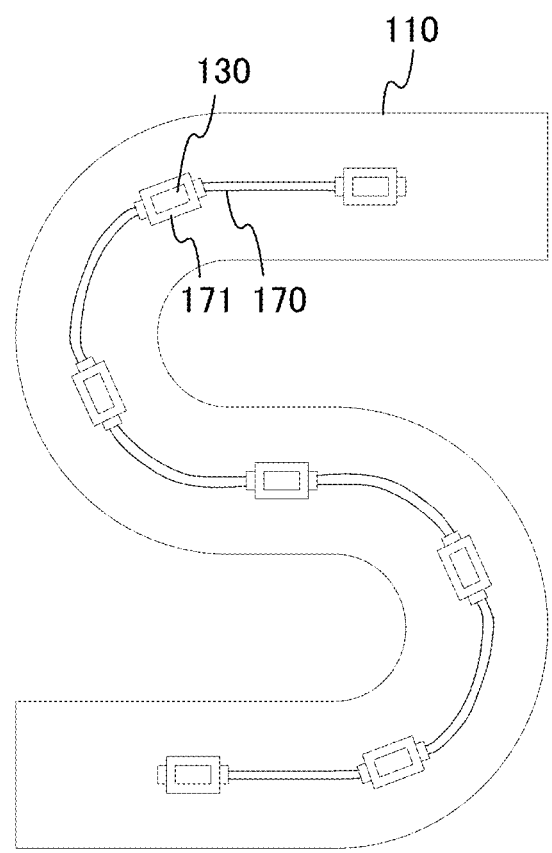
FIG. 26 is a plan view illustrating another configuration of the illumination apparatus according to Embodiment 1.
Figure 27A:
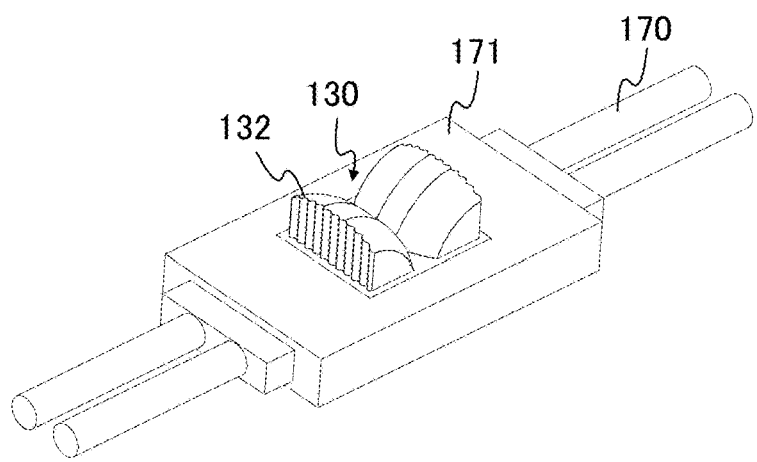
FIGS. 27A to 27C illustrate a configuration of a part of the light-emitting device illustrated in FIG. 26.
Figure 27B:
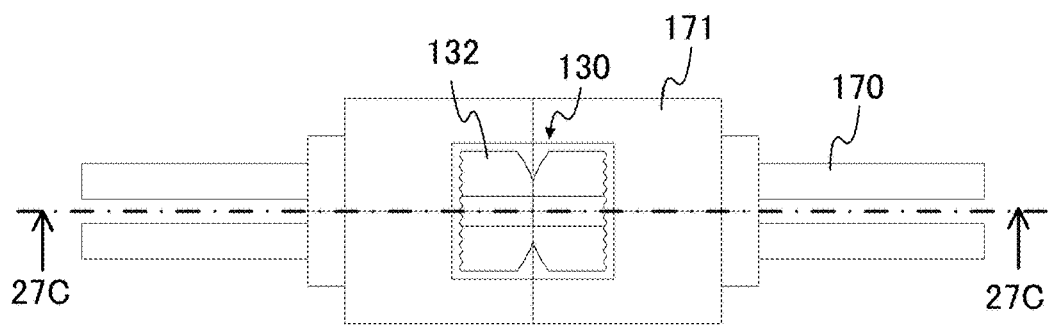
Figure 27C:
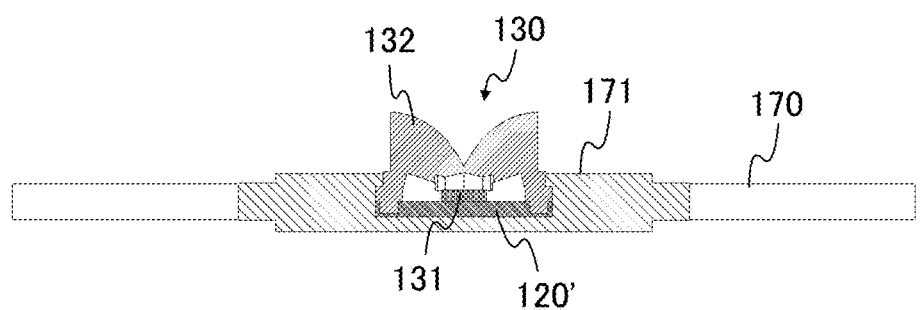

FIG. 26 is a plan view illustrating another configuration of the illumination apparatus according to Embodiment 1. Note that the light diffusion plate is omitted in FIG. 26. In addition, the illumination apparatus illustrated in FIG. 26 is used as a channel letter sign, for example. FIG. 27A is a perspective view of a portion of light-emitting device of FIG. 26, FIG. 27B is a plan view of FIG. 27A, and FIG. 27C is a sectional view taken along line 27C-27C of FIG. 27B. Note that the components identical to those of illumination apparatus 100 according to Embodiment 1 are denoted with the same reference signs, and the description thereof will be omitted.

As illustrated in FIG. 26, illumination apparatus 100 includes housing 110, substrate 120' (not illustrated in the drawing), light-emitting devices 130 and cable 170.

Housing 110 has an S-shape in plan view. Light-emitting element 131 of light-emitting device 130 is electrically connected with a wiring formed on or in substrate 120'. The wirings of substrates 120' are electrically connected with each other with cable 170. The connecting part of substrate 120' and cable 170 is reinforced with caulking member 171. Examples of the material of caulking member 171 include urethane resins, silicone resins and epoxy resins. With this configuration, by electrically connecting light-emitting devices 130 with cable 170 so as to modularize light-emitting devices 130, light-emitting devices 130 may be freely disposed in accordance with the shape of housing 110.

Figure 28:
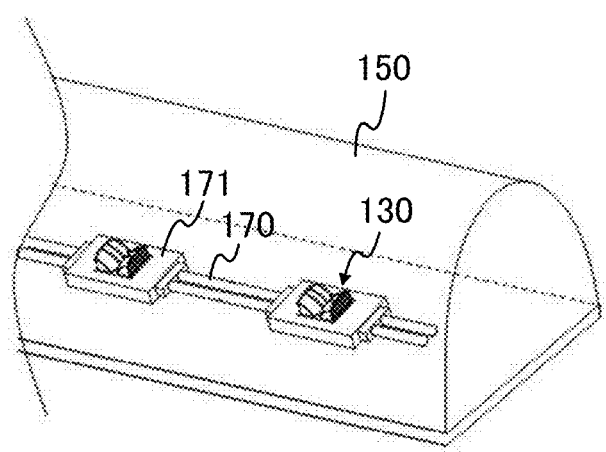
FIG. 28 is a partially enlarged perspective view illustrating another configuration of the illumination apparatus according to Embodiment 1.

FIG. 28 is a partially enlarged perspective view of a configuration of an illumination apparatus according to Embodiment 1. As illustrated in FIG. 28, the top plate and the side plate of housing 110 may be omitted, and the bottom plate of housing 110 may be covered only with light diffusion plate 150.

This application is entitled to and claims the benefit of Japanese Patent Application No. 2016-196620 filed on Oct. 4, 2016, and Japanese Patent Application No. 2017-182710 filed on Sep. 22, 2017, the disclosure each of which including the specification, drawings and abstract is incorporated herein by reference in its entirety.

INDUSTRIAL APPLICABILITY

The illumination apparatus including the light flux controlling member according to the embodiments of the present invention is applicable to sign boards (in particular, channel letter signs), line illuminators and illumination apparatuses, for example.

REFERENCE SIGNS LIST

100 Illumination apparatus
110 Housing
120, 120' Substrate
130 Light-emitting device
131 Light-emitting element 132 Light flux controlling member
133 Incidence surface
133a First top surface
133b Second top surface
133c First side surface
133d Third top surface
133e Second side surface
133f Third side surface
134 Reflection surface
135 Emission surface
136 Flange part
137 Leg part
138 Bottom surface
139 Recess
140 First ridge
141 Second ridge
142 Third ridge
150 Light diffusion plate
170 Cable
171 Caulking member
CA Central axis
LA Light axis

What is claimed is:

1. A light flux controlling member configured to control a distribution of light emitted from a light-emitting element, the light flux controlling member comprising:
   an incidence surface configured to receive the light emitted from the light-emitting element;
   two reflection surfaces disposed opposite to the light-emitting element with the incidence surface interposed between the light-emitting element and the two reflection surfaces, the two reflection surfaces being configured to reflect a part of light that is entered from the incidence surface such that the part of light travels in two opposite directions substantially perpendicular to a light axis of the light-emitting element; and
   two emission surfaces disposed opposite to each other with the two reflection surfaces interposed between the two emission surfaces, the two emission surfaces being configured to emit, to outside, light reflected by the two reflection surfaces,
   wherein a plurality of first ridges are disposed in each of the two emission surfaces, and
   wherein ridgelines of the plurality of first ridges are substantially parallel with the light axis of the light-emitting element as viewed from an emission surface side.

2. The light flux controlling member according to claim 1, wherein a center-to-center distance between each of the plurality of first ridges is constant in a cross-section perpendicular to the light axis of the light-emitting element.

3. The light flux controlling member according to claim 1, wherein a ratio of a center-to-center distance between each of the plurality of first ridges to a height of each of the plurality of first ridges in the cross-section perpendicular to the light axis of the light-emitting element is 2:1 to 13:1.

4. The light flux controlling member according to claim 3, wherein the ratio of the center-to-center distance between each of the plurality of first ridges to the height of each of the plurality of first ridges in the cross-section perpendicular to the light axis of the light-emitting element is 5:1 to 11:1.

5. The light flux controlling member according to claim 4, wherein the center-to-center distance between each of the plurality of first ridges is greater than 0.125 mm and smaller than 2.000 mm in the cross-section perpendicular to the light axis of the light-emitting element.

6. The light flux controlling member according to claim 1,
   wherein a plurality of second ridges are disposed in at least a part of the two reflection surfaces; and
   wherein ridgelines of the plurality of second ridges and the ridgelines of the plurality of first ridges have a positional relationship of skew lines.

7. A light-emitting device, comprising:
   a light-emitting element; and
   the light flux controlling member according to claim 1, wherein the incidence surface is disposed such that the incidence surface intersects the light axis of the light-emitting element.

8. An illumination apparatus, comprising:
   a plurality of the light-emitting devices according to claim 7; and
   a light diffusion plate configured to allow light emitted from the plurality of light-emitting devices to pass through the light diffusion plate while diffusing the light.

* * * * *